United States Patent
Platzker et al.

(10) Patent No.: US 9,576,092 B2
(45) Date of Patent: Feb. 21, 2017

(54) SYNTHESIS USING MULTIPLE SYNTHESIS ENGINE CONFIGURATIONS

(75) Inventors: Daniel M. Platzker, Saratoga, CA (US); Pankaj Mitra, San Jose, CA (US); Alexander Vals, Cupertino, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 602 days.

(21) Appl. No.: 12/391,926

(22) Filed: Feb. 24, 2009

(65) Prior Publication Data

US 2010/0218146 A1 Aug. 26, 2010

(51) Int. Cl.
*G06F 17/50* (2006.01)

(52) U.S. Cl.
CPC .................. *G06F 17/505* (2013.01)

(58) Field of Classification Search
CPC .................................. G06F 17/5045
USPC ........................................... 716/103
See application file for complete search history.

(56) References Cited

U.S. PATENT DOCUMENTS

| | | | |
|---|---|---|---|
| 6,120,549 A * | 9/2000 | Goslin et al. | 703/20 |
| 6,167,558 A * | 12/2000 | Trimberger | 716/117 |
| 6,324,678 B1 * | 11/2001 | Dangelo et al. | 716/103 |
| 6,854,096 B2 * | 2/2005 | Eaton et al. | 716/122 |
| 7,010,774 B1 * | 3/2006 | Wong et al. | 716/103 |
| 7,181,703 B1 * | 2/2007 | Borer et al. | 716/104 |
| 7,284,210 B2 * | 10/2007 | Baumgartner et al. | 716/103 |
| 7,370,295 B1 * | 5/2008 | Chesal et al. | 716/133 |
| 2009/0031277 A1 * | 1/2009 | McElvain et al. | 716/18 |
| 2009/0031278 A1 * | 1/2009 | McElvain et al. | 716/18 |

OTHER PUBLICATIONS

S. Chtourou et al., SystemC Space Exploration of Behavioral Synthesis Options on Area, Performance and Power Consumption, The 17th International Conference on Microelectronics, pp. 67-71, Dec. 2005.*

Chtourou et al., "SystemC Space Exploration of Behavioral Synthesis Options on Area, Performance and Power consumption," *IEEE*, pp. 67-71 (Dec. 2005).

International Search Report dated May 10, 2010, from International Application No. PCT/US2010/025104.

Mentor Graphics, "Precision Synthesis—Excellence in FPGA Synthesis," 8 pp. (document marked 2007).

Written Opinion dated May 10, 2010, from International Application No. PCT/US2010/025104.

Zeh, "Incremental Design Reuse with Partitions," *Xilinx*, .v1.0, 17 pp. (document marked Jun. 7, 2007).

* cited by examiner

*Primary Examiner* — Suresh Memula
(74) *Attorney, Agent, or Firm* — Klarquist Sparkman, LLP

(57) ABSTRACT

Disclosed herein are representative embodiments of methods, systems, and apparatus for performing synthesis. For example, in one exemplary method disclosed herein, a high-level description of a complete circuit design is partitioned into a plurality of sections. Two or more synthesis engine configurations are selected for a respective one of the sections. The respective one of the sections is synthesized using the two or more selected synthesis engine configurations, thereby generating two or more gate-level descriptions. A gate-level description of the complete circuit design is generated that includes at least a portion of one of the gate-level descriptions. Computer-readable media storing instructions for causing a computer to perform any of the disclosed methods are also disclosed herein.

15 Claims, 19 Drawing Sheets

SYNTHESIS USING MULTIPLE SYNTHESIS ENGINE CONFIGURATIONS

FIELD

This application relates generally to the field of synthesis (e.g., synthesizing a high-level description of a circuit design to a gate-level netlist).

BACKGROUND

The design of complex circuits no longer begins with a circuit diagram. Instead, a circuit designer typically will start with a high-level description or representation of the logic functions required for a new circuit. These logic function definitions will often be described using a hardware description language ("HDL") (e.g., a SystemVerilog, Verilog, VHDL, or other register-transfer level ("RTL") description) or even using an algorithmic description (e.g., a C++, SystemC, or other algorithmic description). The designer will then use this functional description to generate a lower-level description or representation of the circuit that describes how the desired functionality is to be implemented. This lower-level representation is typically a gate-level netlist, such as a mapped netlist. Furthermore, the mapped netlist may then be placed and routed, thereby generating a placed and routed netlist. If the design is to be implemented by one or more field programmable gate arrays ("FPGAs"), the placed and routed netlist can then be transformed into one or more binary configuration files suitable for programming the FPGAs.

In general, the process of generating a lower-level circuit description or representation (such as a gate-level netlist) from a high-level description of logic function (such as an RTL or algorithmic description) is referred to as "synthesis." Similarly, a software application used to generate a lower-level circuit description or representation from a high-level description of logic function is referred to as a "synthesis tool." Furthermore, when the design is to be implemented using one or more FPGAs, the synthesis process is referred to as "FPGA synthesis," and the synthesis tools for performing the synthesis are referred to as "FPGA synthesis tools."

An FPGA is a type of integrated circuit device that can be programmed by a user to perform a specific function after it has been manufactured. Because of their flexibility, FPGAs are employed for a wide variety of uses, including telecommunications, digital signal processing, and image and speech recognition. In addition to being employed in end-user products, many designers use FPGAs to emulate a proposed design for an application-specific integrated circuit ("ASIC"). The accuracy of the design can then be tested and verified using the FPGAs before the actual ASIC is manufactured. An FPGA device typically includes an array of configurable logic blocks, routing channels for interconnecting the configurable logic blocks, and programmable switch boxes for connecting the channels. Some FPGA devices also may include other specialized circuit structures, such as memory circuits, input/output logic circuits, and digital signal processor ("DSP") circuits. With this arrangement, a designer can program the configurable logic blocks and the switch blocks so as to configure the FPGA device to provide the desired functionality.

While a variety of synthesis tools have been available for many years, many of these tools still have some difficulty generating an efficient configuration of circuit components from high-level logic functions. For example, a recent article estimated that some FPGA synthesis tools produce circuit configurations that are 70 to 500 times larger than known synthesis solutions. See Richard Goering, "Huge FPGA Synthesis Gap Seen," *EE Times* (Feb. 20, 2006). Inefficient circuit configurations require more area of an FPGA, which in turn may lead to the need for more FPGA devices to implement desired functionality. Further, inefficient circuit configurations may inadvertently create timing problems for the implemented functionality. Similar problems exist for synthesis tools used to implement ASIC designs.

To address these problems, synthesis tool manufacturers continuously seek to develop algorithms that will improve the synthesis process. Due to the complexity and uniqueness of the synthesis algorithms, however, no single synthesis tool is likely to provide an optimal circuit configuration for every given HDL design. Instead, each synthesis tool typically will perform better than other synthesis tools in limited circumstances (e.g., for particular types or portions of circuit designs, or for FPGA synthesis targeting particular types of FPGA architectures).

Accordingly, there is a need for improved synthesis tools that can use multiple synthesis engine configurations (including synthesis engine configurations from different vendors) and can exploit the relative strengths of these various synthesis engine configurations during synthesis.

SUMMARY

Disclosed herein are representative embodiments of methods, systems, and apparatus for performing synthesis using multiple synthesis engine configurations (e.g., using two or more synthesis engines, two or more configurations of a single synthesis engines, or any combination thereof). The disclosed methods, systems, and apparatus should not be construed as limiting in any way. Instead, the present disclosure is directed toward all novel and nonobvious features and aspects of the various disclosed embodiments, alone and in various combinations and subcombinations with one another. The methods, systems, and apparatus are not limited to any specific aspect or feature or combinations thereof, nor do the disclosed methods, systems, or apparatus require that any one or more specific advantages be present or problems be solved.

Embodiments of the disclosed technology relate to the synthesis of netlists from a higher-level description of a circuit design, such as circuit design described in a hardware description language ("HDL") like SystemVerilog, Verilog, or VHDL. In some embodiments of the disclosed technology, an initial higher-level circuit description is provided to a partitioning module. The partitioning module partitions the initial circuit description into one or more sections or blocks. With some implementations of the disclosed technology, the partitioning module may partition the initial circuit description based upon a single criterion, such as timing behavior. Thus, the partitioning module may partition the initial circuit description into one or more sections that are timing sensitive (e.g., fail a timing constraint) and one or more sections that are not timing sensitive (e.g., do not fail a timing constraint). With still other implementations of the disclosed technology, however, the module may partition the initial circuit description based upon two or more criteria, such as timing behavior, power consumption, area, the existence of embedded IP, and/or other such design or performance characteristics. Once the partitioning module has partitioned the initial circuit description into different sections, it can add section markers or indicators to the initial circuit descriptions so that the interfaces between the partitioned sections can be identified.

In various implementations of the disclosed technology, the partitioned initial circuit description or characteristics of the partitioned initial circuit description is provided to an exploration module. Based upon the characteristics of the partitioned initial circuit description, the exploration module can select one or more synthesis engine configurations for use in synthesizing the partitioned initial circuit description. According to some implementations of the disclosed technology, for example, the exploration module can select the synthesis engine configurations according to one or more general characteristics of the partitioned initial circuit design, such as the function of the circuit. For example, if the circuit is intended for use as a digital signal processor, then the exploration module can select one or more synthesis engines and/or configurations that are known to be efficient in synthesizing circuits of similar functionality. The exploration module can also select the synthesis engine and/or its configurations based upon more specific characteristics of the partitioned initial circuit description, such as, for example, the number or types of hardware resources needed to implement the design (e.g., embedded DSPs, multiplier blocks, memory blocks, and/or logic (such as look-up tables ("LUTs") and registers)). The exploration module can also select the synthesis engine configurations based upon the source of one or more portions of the partitioned initial circuit description. For example, if the partitioned initial circuit description includes an intellectual property ("IP") block provided by a particular IP vendor, then the exploration module can select one or more synthesis engines and/or configurations that are recommended by that IP vendor or that are known to be suitable for the IP block based on the characteristics of the IP block. The exploration module can also select the synthesis engine configurations based upon one or more criteria (e.g., user-selected criteria) that are desirably achieved by the synthesis engine. The criteria can include, for example, timing behavior, area, or power consumption.

In various embodiments of the disclosed technology, the partitioned initial circuit description is provided to a dispatch module, which in turn provides the partitioned initial circuit description to one or more synthesis engines using the settings determined by the exploration module. In some implementations of the disclosed technology, the synthesis engines and/or configurations may operate in parallel using a parallel computing system. For example, the dispatch module may be implemented using a master computer, while the synthesis engine configurations may be implemented on a variety of servant computers communicating with the master computer over a suitable computer network (e.g., a local area network, a wide area network, the internet, or other such networks). During the synthesis operation, the synthesis engines can preserve the interface boundaries identified by the section indicators in the initial circuit description.

In certain embodiments of the disclosed technology, after the various synthesis engines and/or configurations have generated gate-level netlists from the initial circuit description, an evaluation module can evaluate the respective partitioned sections using the synthesis results and select one or more of the netlists as the preferred results for each section. In various implementations of the disclosed technology, the evaluation module will evaluate the respective sections based upon the criteria used to create the original section from the initial circuit description. For example, if the partition module partitioned a section of the initial circuit description because the operation of this section was timing sensitive, then the evaluation module may determine the timing delay for each corresponding section in the synthesis results and select the corresponding section having the smallest timing delay. After the evaluation module has selected results for each section in the partitioned initial circuit design, an assembly module combines the respective sections from the selected results into a composite synthesized gate-level netlist.

In one exemplary embodiment disclosed herein, a high-level description of a complete circuit design is partitioned into a plurality of sections. Two or more synthesis engine configurations are selected for a respective one of the sections. The respective one of the sections is synthesized using the two or more selected synthesis engine configurations, thereby generating two or more gate-level descriptions. A gate-level description of the complete circuit design is generated that includes at least a portion of one of the gate-level descriptions. The generated gate-level description of the complete circuit design can be stored in one or more computer-readable media. In some implementations, the selecting the one or more synthesis engine configurations is performed using engine characteristic data stored in an engine characteristic database. The engine characteristic database can comprise, for example, data indicative of performance characteristics of a plurality of candidate synthesis engine configurations. In particular implementations, synthesis results are generated during synthesis and the engine characteristic database is updated using data from the synthesis results. In certain implementations, the two or more synthesis engine configurations are selected based on one or more criteria, such as one or more of timing behavior, area, target architecture, intended function, or power consumption for the respective one of the sections. The criteria can also include one or more of synthesis run time or available synthesis tool licenses. Any of the criteria can be selected by a user. In some implementations, the two or more synthesis engine configurations are selected by identifying that the respective one of the sections comprises proprietary IP, and selecting at least one of the synthesis engine configurations based on the identification. In some implementations, one of the two or more gate-level descriptions corresponding to the respective one of the sections is selected for inclusion in the gate-level description of the complete circuit design. The selection of the one of the two or more gate-level descriptions can be based on one or more criteria, such as one or more of estimated timing behavior, area, or power consumption of the two or more gate-level descriptions generated for the respective one of the sections. In certain implementations, the two or more synthesis engine configurations are implemented by a single synthesis engine using different synthesis engine settings and/or two different synthesis engines from two different synthesis engine vendors. In some implementations, portions of the high-level description of the complete circuit design are identified that do not satisfy one or more criteria when the high-level description is synthesized by a single synthesis engine configuration during a preliminary synthesis run. In some implementations, synthesis is performed so that interfaces between the partitioned sections are preserved during the synthesis process. In further implementations, the gate-level description of the complete circuit design is evaluated to determine whether one or more criteria are met by the gate-level description of the complete circuit design, and one or more iterations of the synthesizing and the generating are performed if the one or more criteria are not met. In these implementations, a maximum number of iterations can be selected by a user. Further, the one or more iterations can be performed until the one or more criteria are met or until a user-selected run time is reached.

In another embodiment disclosed herein, a plurality of synthesis engine configurations for synthesizing a high-level description of a circuit or circuit portion is selected. The high-level description is caused to be synthesized using at least two of the synthesis engine configurations, thereby generating at least two lower-level descriptions of the circuit or the circuit portion. The at least two lower-level descriptions are evaluated according to one or more criteria. A preferred one of the at least two lower-level descriptions is selected based on the evaluation. The preferred one of the lower-level descriptions can be stored in one or more computer-readable media. In some implementations, the one or more criteria comprise at least one of estimated timing behavior, area, or power consumption of the at least two lower-level descriptions. The one or more criteria can be selected by a user. In certain implementations, a first of the synthesis engine configurations targets a first type of field programmable gate array and a second of the synthesis engine configurations targets a second type of field programmable gate array. In these implementations, the one or more criteria can include an estimated cost of the first and second field programmable gate arrays. In some implementations, the plurality of synthesis engine configurations are selected by evaluating and selecting candidate synthesis engine configurations according to the one or more criteria. In further implementations, the preferred one of the lower-level descriptions is used to replace a corresponding portion of a lower-level description of the circuit, thereby creating a modified lower-level description of the circuit. The modified lower-level description of the circuit can be stored in one or more computer-readable media. In some implementations, the high-level description is synthesized by instructing a first computing resource to perform synthesis of the high-level description using a first synthesis engine configuration, and instructing a second computing resource to simultaneously perform synthesis of the high-level description using a second synthesis engine configuration. In these implementations, the first computing resource and the second computing resource can be remote or local computing resources. In some implementations, the plurality of synthesis engine configurations are selected by identifying one or more available synthesis resources, and selecting the plurality of synthesis engine configurations based on the available synthesis resources. In certain implementations, the plurality of synthesis engine configurations are selected by allowing a user to select one or more synthesis resources, and selecting the plurality of synthesis engine configurations based on the synthesis resources selected by the user.

In another disclosed embodiment, a synthesis run is performed on a high-level description of a circuit design in order to generate a lower-level description and one or more performance reports. The synthesis run is performed using a first synthesis engine configuration. One or more sections of the high-level description are identified to be synthesized using a synthesis engine configuration different than the first synthesis engine by evaluating at least one of the high-level description or the one or more performance reports according to one or more criteria. Indications of the identified one or more sections for use with the high-level description of the circuit design are generated. The indications of the identified one or more sections are stored in a computer-readable medium. The one or more criteria can comprise at least one of estimated timing behavior, area, or power consumption. Furthermore, the one or more criteria can be selected by a user. In certain implementations, the one or more criteria include timing behavior, and the evaluation is performed by identifying one or more paths in the circuit design that fail a timing constraint, identifying one or more portions of the circuit design that are traversed by the one or more paths, and including at least one of the portions of the circuit design traversed by the one or more paths as at least one of the sections identified. In some implementations, the one or more criteria include the existence of proprietary IP, and the evaluation is performed by identifying a section of the high-level description as being proprietary IP, and including the section as at least one of the sections identified. In certain implementations, the indications of the identified one or more sections are generated by generating one or more HDL wrappers corresponding to the identified one or more sections. In any of these implementations, the indications can enable interfaces to the identified one or more sections to be preserved during synthesis.

In another disclosed embodiment, a first synthesis run is caused to be performed using a first synthesis tool from a first vendor. The first synthesis run generates a first netlist portion for a first portion of a circuit design. Further, a second synthesis run is caused to be performed using a second synthesis tool from a second vendor. The second synthesis run generates a second netlist portion for a second portion of the circuit design. A full netlist is then generated for the circuit design, where the full netlist comprises the first netlist portion and the second netlist portion. In some implementations, at least one of the first synthesis run or the second synthesis run is performed using a remote computing resource. In certain implementations, the first netlist portion is part of a full netlist generated by the first synthesis run. In some implementations, the first synthesis run targets a first type of field programmable gate array and the second synthesis run targets a second type of field programmable gate array. In further implementations, a preliminary synthesis run is performed for a high-level description of the circuit design, and the first portion of the circuit design and the second portion of the circuit design are identified using results of the preliminary synthesis run. In certain implementations, a first synthesis engine configuration for the first synthesis run and a second synthesis engine configuration for the second synthesis run are identified using the results of the preliminary synthesis run.

In another disclosed embodiment, a high-level description of a circuit design is partitioned into at least a first partition corresponding to a first portion of the circuit design and a partition corresponding to a remainder of the circuit design. The high-level description of the circuit design is synthesized using a first synthesis engine configuration, thereby generating a first gate-level description of the circuit design. A portion of the high-level description corresponding to the first partition is synthesized together with a portion of the first gate-level description corresponding to the remainder of the circuit design using a second synthesis engine configuration, thereby generating a second gate-level description of the circuit design. The second gate-level netlist can be stored in a computer-readable medium. In some implementations, the synthesis of the high-level description of the circuit design using the first synthesis engine configuration is performed so that input and output interfaces between the first partition and the partition corresponding to the remainder of the circuit design are preserved. In certain implementations, the act of partitioning comprises adding a wrapper to the high-level description of the circuit design. In some implementations, the first synthesis engine configuration is configured to improve a first performance criteria for the remainder of the circuit design and the second synthesis engine configuration is configured to improve a second performance criteria for the first portion of the circuit design.

In another embodiment disclosed herein, a high-level description of a circuit design is partitioned into at least a first partition corresponding to a first portion of the circuit design and a partition corresponding to a remainder of the circuit design. At least a part of the high-level description of the circuit design is synthesized using a first synthesis engine configuration, thereby generating a first gate-level description of the circuit design. At least a part of the high-level description of the circuit design is synthesized using a second synthesis engine configuration, thereby generating a second gate-level description of the circuit design. A portion of the first gate-level description corresponding to the first partition is assembled with a portion of the second gate-level description corresponding to the remainder of the circuit design to create a third gate-level description of the circuit design. The third gate-level netlist can be stored in a computer-readable medium. In some implementations, the synthesis of the high-level description of the circuit design using the first synthesis engine configuration and the high-level description of the circuit design using the second synthesis engine configuration are both performed so that input and output interfaces between the first partition and the partition corresponding to the remainder of the circuit design are preserved. In certain implementations, the first synthesis engine configuration is configured to improve a first performance criteria for the first portion of the circuit design and the second synthesis engine configuration is configured to improve a second performance criteria different than the first performance criteria for the second portion of the circuit design. In some implementations, the first partition is not synthesized by the second synthesis engine configuration and the second partition is not synthesized by the first synthesis engine configuration.

Embodiments of the disclosed methods can be performed by software stored on one or more tangible computer-readable media (e.g., one or more optical media discs, volatile memory components (such as DRAM or SRAM), or nonvolatile memory components (such as hard drives)) and executed on a computer. Such software can comprise, for example, an electronic-design-automation ("EDA") synthesis tool. Such software can be executed on a single computer or on a networked computer (e.g., via the Internet, a wide-area network, a local-area network, a client-server network, or other such network). Additionally, any circuit description, design file, data structure, data file, intermediate result, or final result (e.g., a portion or all of a high-level circuit description, a portion or all of a gate-level netlist, data indicative of synthesis engine characteristics, data indicative of selected evaluation criteria, data indicative of selected synthesis engine configurations or of selected netlists) created or modified using any of the disclosed methods can be stored on a tangible computer-readable storage medium (e.g., one or more optical media discs, volatile memory components (such as DRAM or SRAM), or nonvolatile memory components (such as hard drives)). Furthermore, any of the software embodiments (comprising, for example, computer-executable instructions for causing a computer to perform any of the disclosed methods) or circuit descriptions, design files, data structures, data files, intermediate results, or final results created or modified by the disclosed methods can be transmitted, received, or accessed through a suitable communication means.

The foregoing and other objects, features, and advantages of the disclosed technology will become more apparent from the following detailed description, which proceeds with reference to the accompanying figures.

DETAILED DESCRIPTION

I. General Considerations

Figure 1:
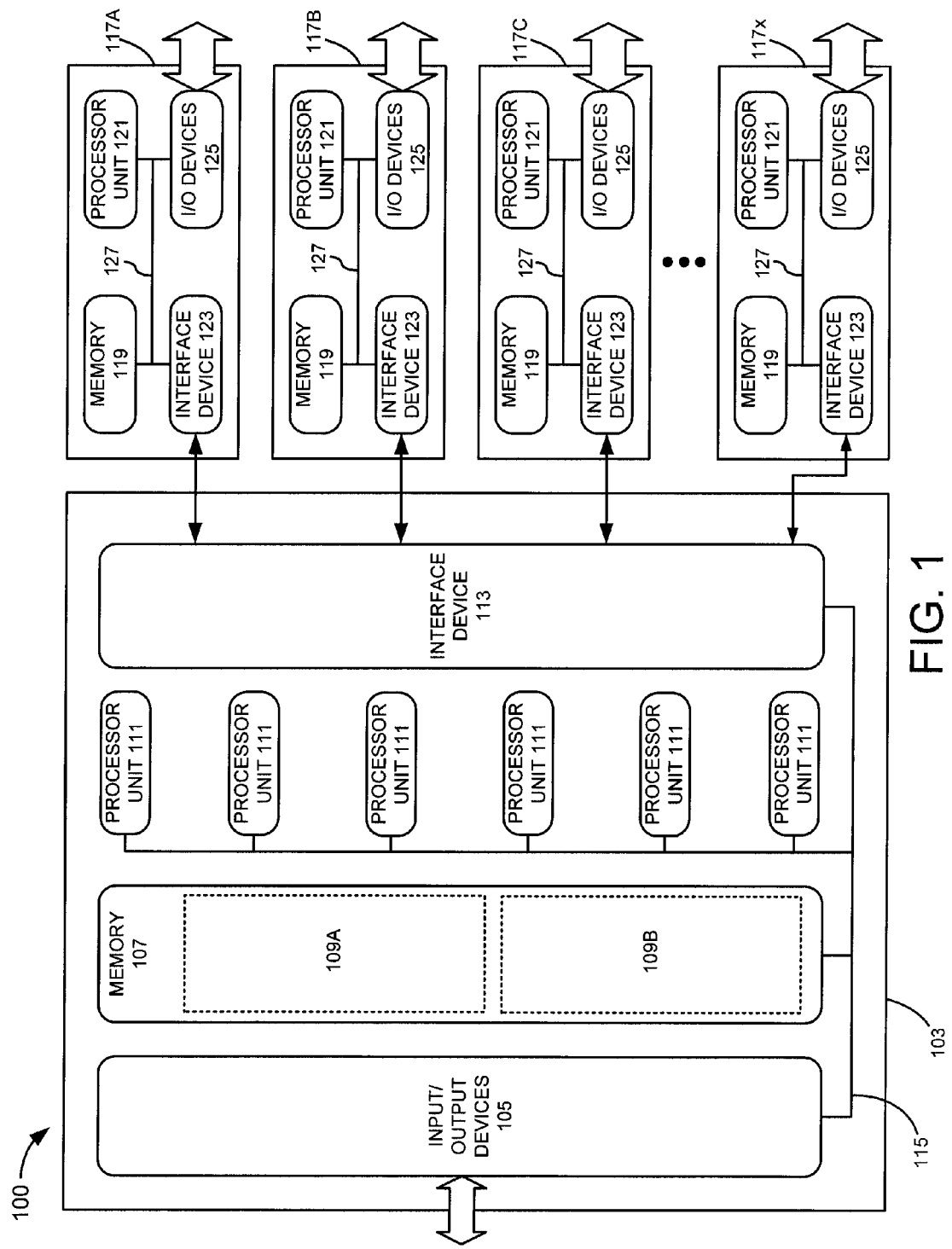
FIG. 1 is a block diagram illustrating an exemplary computer network suitable for performing embodiments of the disclosed technology.

Disclosed herein are representative embodiments of methods, systems, and apparatus for performing synthesis using multiple synthesis engine configurations (e.g., using two or more synthesis engines, two or more configurations of a single synthesis engines, or any combination thereof). The disclosed methods, systems, and apparatus should not be construed as limiting in any way. Instead, the present disclosure is directed toward all novel and nonobvious features and aspects of the various disclosed embodiments, alone and in various combinations and subcombinations with one another. The methods, systems, and apparatus are not limited to any specific aspect or feature or combinations thereof, nor do the disclosed methods, systems, or apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods or modules can be used in conjunction with other methods or modules. Additionally, the description sometimes uses terms like "decide" and "provide" to describe the disclosed methods. These terms are high-level abstractions of the actual operations that are performed. The actual operations that correspond to these terms can vary depending on the particular implementation and are readily discernible by one of ordinary skill in the art.

The disclosed technology can be used to synthesize a circuit design (e.g., to synthesize a high-level circuit description into a gate-level netlist for implementation on a field-programmable gate array ("FPGA") or with an application specific integrated circuit ("ASIC")). Embodiments of the disclosed technology, for example, enable a user to use multiple synthesis engine configurations for different sections of a circuit description and to select a result that best suits the user's objectives, all using a single software platform and within a short amount of time. The disclosed technology is mainly described in connection with FPGA synthesis. The particular application of this technology to FPGA synthesis should not be construed as limiting, however, as any aspect of the technology can be used during the design and implementation of other integrated circuits (e.g., application-specific integrated circuits ("ASIC"), other programmable logic devices ("PLDs"), systems-on-a-chip ("SoCs"), or microprocessors).

Embodiments of the disclosed methods can be used to modify or create a circuit represented as a circuit description stored on one or more computer-readable media. The circuit description can comprise, for example, one or more design files or data structures representing the circuit (e.g., a high-level circuit description (such as SystemVerilog, Verilog, VHDL, or other register-transfer-level description), a gate-level netlist, or the like) and may be created or modified on a single computer or via a network.

As more fully explained below, embodiments of the disclosed methods can be performed by software stored on one or more tangible computer-readable media (e.g., one or more optical media discs, volatile memory components (such as DRAM or SRAM), or nonvolatile memory components (such as hard drives)) and executed on a computer. Such software can comprise, for example, an electronic-design-automation ("EDA") synthesis tool. Such software can be executed on a single computer or on a networked computer (e.g., via the Internet, a wide-area network, a local-area network, a client-server network, or other such network). The software embodiments disclosed herein can be described in the general context of computer-executable instructions, such as those included in program modules, which can be executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment. For clarity, only certain selected aspects of the software-based implementations are described. Other details that are well known in the art are omitted. For example, it should be understood that the disclosed technology is not limited to any specific computer language, program, or computer.

Additionally, any circuit description, design file, data structure, data file, intermediate result, or final result (e.g., a portion or all of a high-level circuit description, a portion or all of a gate-level netlist, data indicative of synthesis engine characteristics, data indicative of selected evaluation criteria, data indicative of selected synthesis engine configurations or of selected netlists) created or modified using any of the disclosed methods can be stored on a tangible computer-readable storage medium (e.g., one or more optical media discs, volatile memory components (such as DRAM or SRAM), or nonvolatile memory components (such as hard drives)).

Furthermore, any of the software embodiments (comprising, for example, computer-executable instructions for causing a computer to perform any of the disclosed methods) can be transmitted, received, or accessed through a suitable communication means. Similarly, any circuit description, design file, data structure, data file, intermediate result, or final result (e.g., a portion or all of a high-level circuit description, a portion or all of a gate-level netlist, data indicative of synthesis engine characteristics, data indicative of selected evaluation criteria, data indicative of selected synthesis engine configurations or of selected netlists) created or modified using any of the disclosed methods can be transmitted, received, or accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means. Such communication means can be, for example, part of a shared or private network.

Moreover, any circuit description, design file, data structure, data file, intermediate result, or final result (e.g., a portion or all of a high-level circuit description, a portion or all of a gate-level netlist, data indicative of synthesis engine characteristics, data indicative of selected evaluation criteria, data indicative of selected synthesis engine configurations or of selected netlists) produced by any of the disclosed methods can be displayed to a user using a suitable display device (e.g., a computer monitor or display). Such displaying can be performed as part of a computer-implemented method of performing any of the disclosed methods.

II. Exemplary Operating Environments

The execution of various electronic design automation processes according to embodiments of the disclosed technology can be implemented using computer-executable software instructions executed by one or more programmable computing devices. Because these embodiments of the disclosed technology can be implemented using software instructions, the components and operation of a generic programmable computer system on which various embodiments of the disclosed technology can be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner, or pointing device for receiving input from a user. The output devices may include a display monitor, speaker, printer, or tactile feedback device. These devices and their connections are well known in the art, and thus will not be discussed at length here.

The memory 107 may similarly be implemented using any combination of tangible computer readable media that can be accessed by the master computer 103. The tangible computer readable media may include, for example, microcircuit memory devices such as read-write memory ("RAM"), read-only memory ("ROM"), electronically erasable and programmable read-only memory ("EEPROM"), or flash memory microcircuit devices, CD-ROM disks, digital video disks ("DVD"), or other optical storage devices. The tangible computer readable media may also include magnetic cassettes, magnetic tapes, magnetic disks, or other magnetic storage devices, punched media, holographic storage devices, or any other tangible medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will ordinarily be a microprocessor device. For example, one or more of the processor units 111 may be a commercially generic programmable microprocessor, such as Intel® Pentium® or Xeon™ microprocessor, Advanced Micro Devices Athlon™ microprocessor or Motorola 68K/Coldfire® microprocessor. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
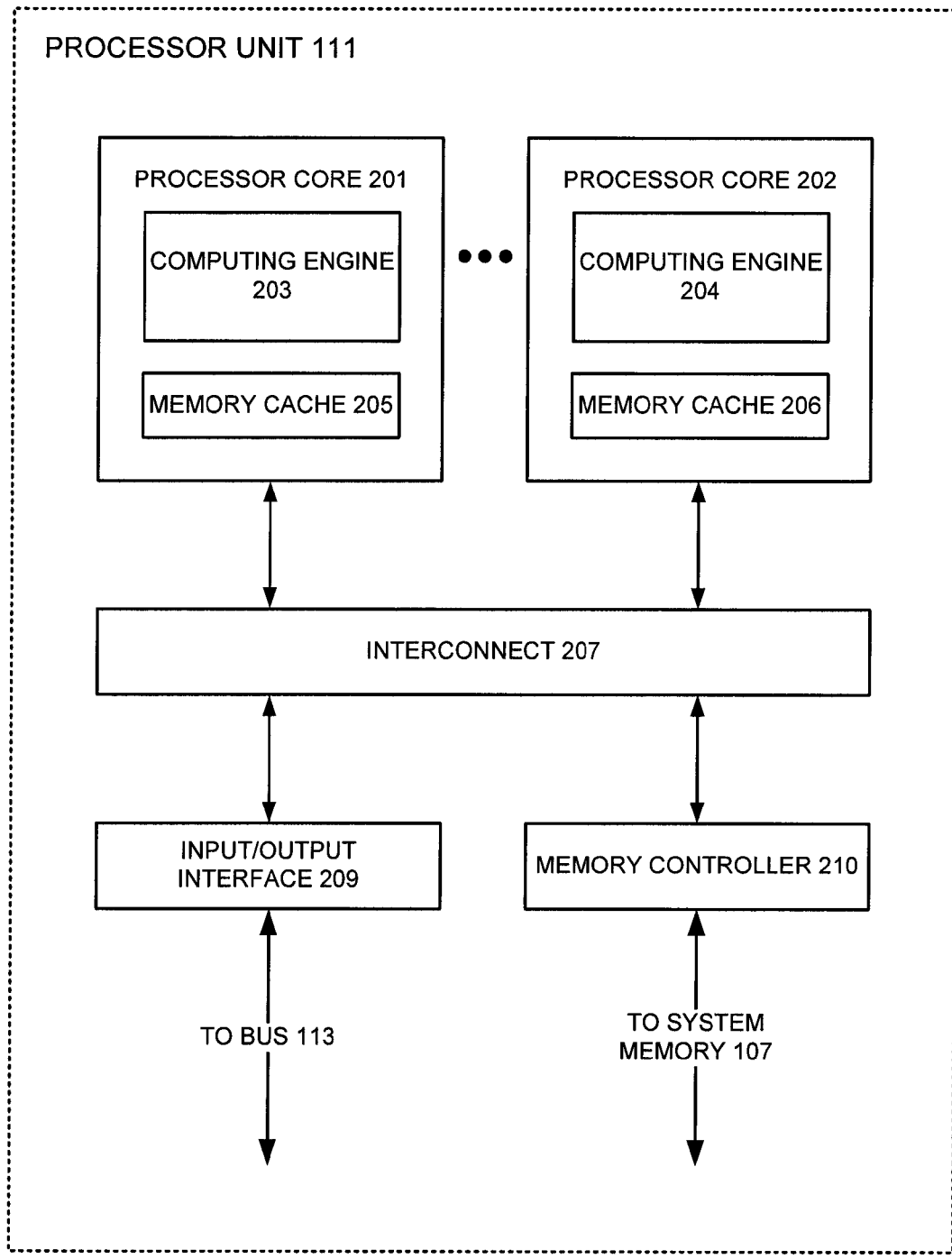
FIG. 2 is a block diagram illustrating an exemplary processing unit that can be used as part of the computer network shown in FIG. 1.

With some implementations of the invention, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201, 202. Each processor core 201, 202 includes a respective computing engine 203, 204 and a respective memory cache 205, 206. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each of the processor cores 201, 202 is connected to an interconnect 207. The particular construction of the interconnect 207 may vary depending upon the architecture of the processor unit 201. With some processor cores 201, 202 such as the Cell microprocessor created by Sony Corporation, Toshiba Corporation and IBM Corporation, the interconnect 207 may be implemented as an interconnect bus. With other processor cores 201, 202, however, such as the Opteron™ and Athlon™ dual-core processors available from Advanced Micro Devices of Sunnyvale, Calif., the interconnect 207 may be implemented as a system request interface device. In any case, the processor cores 201, 202 communicate through the interconnect 207 with an input/output interface 209 and a memory controller 210. The input/output interface 209 provides a communication interface between the processor cores 201, 202 and the bus 115. Similarly, the memory controller 210 controls the exchange of information between the processor cores 201, 202 and the system memory 107. With some implementations of the disclosed technology, each of the processor cores 201, 202 may include additional components, such as a high-level cache memory, which may be shared by the processor cores 201, 202. While FIG. 2 shows one illustration of a processor unit 111 that may be employed by some embodiments of the disclosed technology, it should be appreciated that this illustration is representative only, and is not intended to be limiting.

It also should be appreciated that, with some implementations, multiple separate processor units can be used in lieu of a multi-core processor unit. Furthermore, an alternate implementation of the disclosed technology may employ a single processor unit having six cores, two multi-core processor units each having three cores, a multi-core processor unit with four cores together with two separate single-core processor units, and so on.

Returning now to FIG. 1, the interface device 113 allows the master computer 103 to communicate with the servant computers 117A, 117B, 117C . . . 117x through a communication interface. The communication interface can be any suitable type of interface including, for example, a wired network connection or an optically transmissive wired network connection. The communication interface can also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol ("TCP"), the user datagram protocol ("UDP"), or the Internet protocol ("IP"). These and other communication protocols are well known in the art, and thus will not be discussed here in more detail.

Each servant computer 117 can include a memory 119, a processor unit 121, an interface device 123, and, optionally, one more input/output devices 125 connected together by a system bus 127. As with the master computer 103, the optional input/output devices 125 for the servant computers 117 can include any input or output devices, such as keyboards, pointing devices, microphones, display monitors, speakers, and printers. Similarly, the processor units 121 can be any type of general processing device or custom-manufactured programmable processor device. For example, one or more of the processor units 121 can be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 can be custom-manufactured processors, such as microprocessors designed to optimally perform specific types of mathematical operations. Still further, one or more of the processor units 121 can have more than one core, as described with reference to FIG. 2 above. For example, with some implementations of the disclosed technology, one or more of the processor units 121 can be a Cell processor. The memory 119 then can be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology can employ a master computer having single processor unit 111. Further, one or more of the servant computers 117 can have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 can be connected to one or more external data storage devices. These external data storage devices can be implemented using any combination of tangible computer readable media that can be accessed by the master computer 103. The tangible computer readable media can include, for example, microcircuit memory devices such as read-write memory ("RAM"), read-only memory ("ROM"), electronically erasable and programmable read-only memory ("EEPROM") or flash memory microcircuit devices, CD-ROM disks, digital video disks ("DVD"), or other optical storage devices. The tangible computer readable media may also include magnetic cassettes, magnetic tapes, magnetic disks, or other magnetic storage devices, punched media, holographic storage devices, or any other tangible medium that can be used to store desired information. According to some implementations of the disclosed technology, one or more of the servant computers 117 can alternately or additionally be connected to one or more external data storage devices. Typically, these external data storage devices will include data storage devices that also are connected to the master computer 103, but they also can be different from any data storage devices accessible by the master computer 103.

It also should be appreciated that the description of the computer network illustrated in FIG. 1 and FIG. 2 is provided as an example only and is not intended to suggest any limitation as to the scope of use or functionality of alternate embodiments of the disclosed technology. For example, any of the embodiments of the disclosed technology can be implemented on a single computer having a single processor.

III. Synthesis Using Multiple Synthesis Engine Configurations

Figure 3:
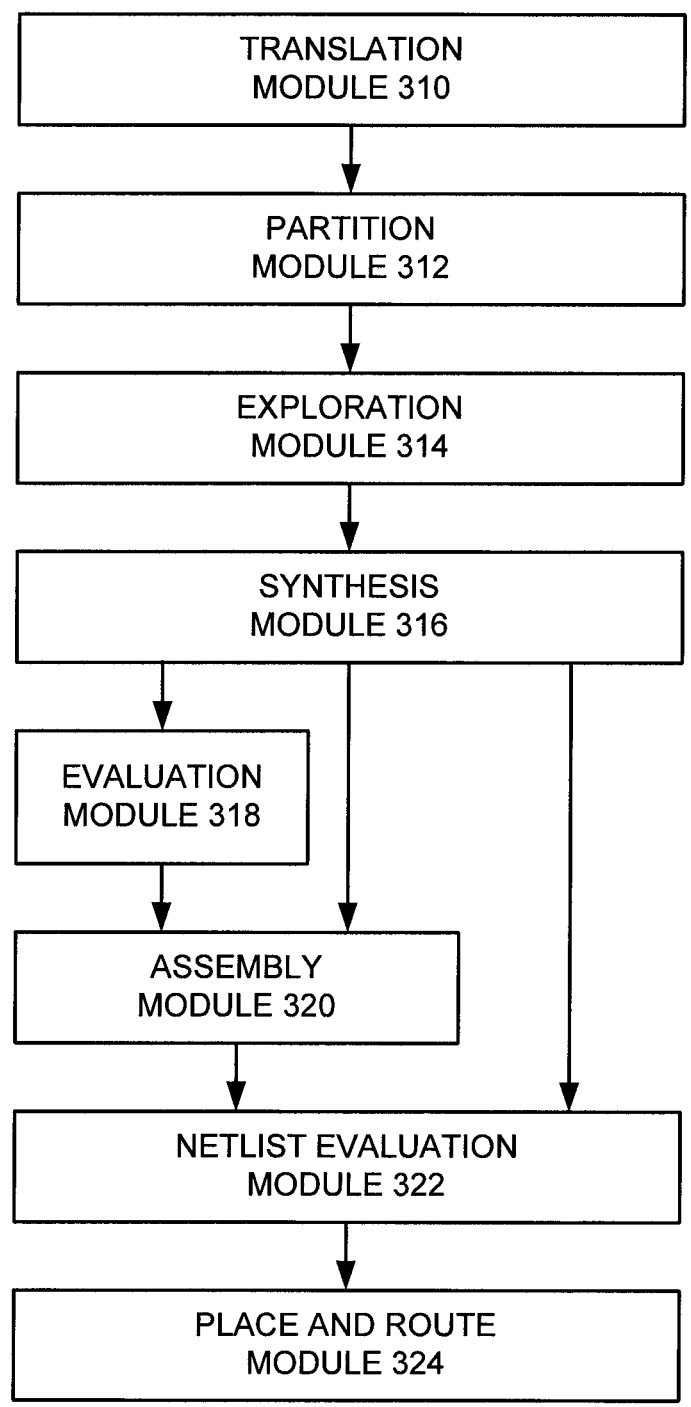
FIG. 3 is a block diagram illustrating components of an exemplary embodiment of a synthesis tool in accordance with the disclosed technology.

A. General Overview of an Exemplary Synthesis Tool Using Multiple Synthesis Engine Configurations An exemplary framework of a synthesis tool 300 for performing synthesis according to the disclosed technology is illustrated in FIG. 3. The illustrated components can consist of one or more software modules configured to interact and exchange information among each other as indicated. It should be understood that the synthesis tool framework illustrated in FIG. 3 is not to be construed as limiting, as embodiments of the disclosed technology can include different combinations and subcombinations of the illustrated modules. For example, embodiments of the disclosed technology can comprise fewer than all of the illustrated modules or additional modules not shown. Before describing implementations of the individual modules in greater detail, a brief overview of the modules shown in FIG. 3 is provided.

In general, the synthesis tool 300 illustrated in FIG. 3 is capable of partitioning a design into multiple sections (also referred to as "blocks") and performing synthesis on each of the multiple sections using one or more different synthesis engine configurations. The synthesis engine configuration can comprise different configurations of the same synthesis engine, configurations from two or more different synthesis engines or tools, or any combination thereof. The illustrated synthesis tool 300 is also capable of reassembling selected synthesized netlists for the various sections into a single full netlist representing the complete design. Using the illustrated synthesis tool 300, sections of a design can be synthesized using different constraints and/or using different synthesis engines during the synthesis process. As part of the synthesis process, the resulting netlists for the different design sections can be compared to one another and the most desired result selected using a wide variety of criteria (e.g., estimated speed, area, power, and/or other such design or performance criteria). In this way, the capabilities of various synthesis engines can be exploited and used for portions of a design where those capabilities are most useful. In general, this multi-synthesis-engine-configuration approach can produce higher quality of result (QoR) netlists in a shorter amount of time than by using conventional synthesis tools. Moreover, in particular implementations, the synthesis tool 300 provides a single synthesis environment for the user, even though the synthesis tool 300 may use synthesis engines from multiple vendors. This single framework and interface eliminates the need for a user to learn the various protocols, syntaxes, and formats that exist among the various synthesis engines offered by different EDA vendors.

In the illustrated embodiment, the translation module 310 receives (e.g., loads or buffers into memory) data representative of the design to be synthesized, the resources available to the synthesis tool, and/or any design constraints to be considered during synthesis. The translation module 310 is configured to translate this data into a common format used by the synthesis tool 300. In general, the translation module 310 allows the synthesis tool 300 to be compatible with a wide variety of design formats.

The partition module 312 evaluates the design and, if appropriate, partitions the design into sections that are desirably synthesized using different synthesis engine configurations than the remainder of the design. To perform the evaluation, the partition module 312 of certain embodiments performs one or more initial synthesis runs. The results of these runs can be evaluated to identify areas of the design that could be improved using different synthesis engine configurations. For example, one or more sections of the design may be identified as being problematic for failing to meet a desired timing constraint, area constraint, power constraint, or other such performance criteria. Additionally, one or more sections of the design may be partitioned because they represent an embedded IP block in the design that is desirably synthesized using a particular synthesis engine (e.g., a synthesis engine recommended by the vendor of the IP block). The constraints or criteria that are used to evaluate the one or more initial synthesis runs can be provided by the user as part of the constraints data that is loaded by the translation module 310 or through a suitable user interface.

The exploration module 314 determines which synthesis engine configuration to use to synthesize the respective sections of the design identified by the partition module 312. For instance, for each partitioned section of the design, the exploration module 314 can select one or more synthesis engine configurations that are likely to produce desired synthesis improvements (e.g., improved timing, area, power, or other such performance characteristics). It should be noted that the synthesis engine configurations referred to and selected by the exploration module 314 include instances of the same synthesis engine operating with different configurations (e.g., with different switches or optimizations set), instances of different synthesis engines operating with the same or different configurations, or any combination thereof.

In certain embodiments, the intended function performed by an identified circuit section can be used by the exploration module 314 to help determine the appropriate synthesis engine configuration to use during synthesis. For instance, if the identified circuit section will be used for video processing, certain synthesis configurations may be better suited than other synthesis engine configurations. A database storing information about various synthesis engine configurations and their performance characteristics can be accessed by the exploration module 314. The database may also include information about which synthesis engine configurations are well suited for particular circuit functions. The database can initially include information supplied by the vendor of a synthesis engine but can be periodically or continuously updated using heuristic data generated through ongoing use of the synthesis tool 300 or using heuristic data generated by the vendor of the synthesis tool 300.

The synthesis module 316 prepares and dispatches the various synthesis runs using the synthesis engine configurations selected by the exploration module 314. The synthesis module 316 can use resource information obtained by the translation module 310 to perform this function. To prepare the various synthesis runs, the synthesis module 316 of certain embodiments of the disclosed technology inserts markers or indicators into the original circuit description that demarcate the sections identified by the partition module 312. For instance, the markers may be in the form of a "wrapper" (e.g., an HDL wrapper) that allows the inputs and outputs of the section (the interface of the section) to be preserved during synthesis while still allowing for certain optimizations to occur during synthesis. By inserting markers into the original description of the circuit design, the entire description can be loaded and used by the synthesis engine configurations selected by the exploration module 314. To dispatch the synthesis runs, the synthesis module can use the information obtained by the translation module 310 about the available resources—including, for example, the speed and number of processing resources available (e.g., in a server farm)—and can also use information about the expected run time of each synthesis engine configuration. Based on this information, the synthesis module 316 may limit or alter the synthesis runs selected by the exploration module 314. In particular embodiments, the synthesis module 316 can also dispatch one or more synthesis runs that are configured to synthesize those portions of the design that are not selected by the partition module 314. For example, these one or more synthesis runs are referred to herein as "backdrop runs" and are generally performed using different synthesis engine configurations than the other synthesis runs. In general, a netlist from the backdrop runs can be combined with the netlists from the other synthesis runs to form a complete netlist that contains netlist portions that are optimized for the corresponding sections of the circuit.

The evaluation module 318 evaluates the results of the synthesis runs for each circuit section identified by the partition module 312 and selects a netlist for each circuit section from the results. The selection can be made, for example, based on the criteria originally used by the partition module 312. For instance, the selection can be made based on estimated timing behavior, area, power consumption, or other such design or performance criteria. In particular embodiments, the evaluation module 318 focuses on the performance or design improvements to the particular section of the circuit that the synthesis run targeted. Thus, for example, a particular synthesis run result may be discarded because the desired improvements were not seen in the targeted section of the circuit, even though other portions of the design exhibit the desired improvements. In other embodiments, improvements to the design as a whole are considered by the evaluation module 318 (e.g., as a weighted factor).

If multiple backdrop runs are performed, the evaluation module 318 can select from among the resulting backdrop netlists based on different criteria (e.g., on the area improvements in the backdrop netlists if the other synthesis runs targeted timing, or vice versa). During this evaluation process, the evaluation module 318 can focus its evaluation just on the remaining portion of the design that does not include the sections identified by the partition module 312. In some situations, single synthesis runs are selected and performed for one or more of the sections of the circuit identified by the partition module 312. In these cases, the evaluation module 318 can be bypassed as shown in FIG. 3. Furthermore, in some instances, the partition module does not identify any circuit sections to be separately synthesized. In these cases, the evaluation module 318 and the assembly module 320 can both be bypassed as also shown in FIG. 3.

The assembly module 320 combines the netlists selected by the evaluation module 318 into a single netlist. For example, in particular implementations, the sections markers inserted by the synthesis module 316 are used to preserve the boundaries of the circuit sections identified by the partition module 312 during the synthesis process, allowing portions of the netlists corresponding to the identified sections to be identified and copied into one another. In one particular implementation, netlist portions of the selected backdrop netlist are replaced with corresponding netlist portions from the netlists selected by the evaluation module 318 and corresponding to the sections identified by the partition module 312. The assembly module 320 produces a final netlist.

The netlist evaluation module 322 evaluates the final netlist against one or more criteria (e.g., the original criteria used by the partition module) such as estimated timing behavior, area, power consumption, or other such design or performance criteria. This evaluation procedure can be performed automatically or with user input (e.g., using a sortable report displayed to the user). If the desired criteria are not met, the evaluation module 322 can cause the synthesis tool 300 to perform another iteration of synthesis. During any iteration, the final netlist from a previous iteration can be used as the original design input to the partition module 312. If the desired criteria are met, then the final netlist can be placed and routed with place and route module 324. The place and route module 324 performs a place and route operation on the final netlist for a target architecture (e.g., a targeted FPGA device).

B. Embodiments of the Translation Module

As noted above, the translation module 310 can be configured to receive and translate data representative of the design to be synthesized, the resources available to the synthesis tool, and/or any design constraints to be considered during synthesis. In general, the process of translation involves extracting data from a file, data structure, or database in one format and transferring the data into another file, data structure, or database having a common format used by the synthesis tool. This produces data in a single compatible format and allows the synthesis tool 300 to operate using a common user interface.

Figure 4:
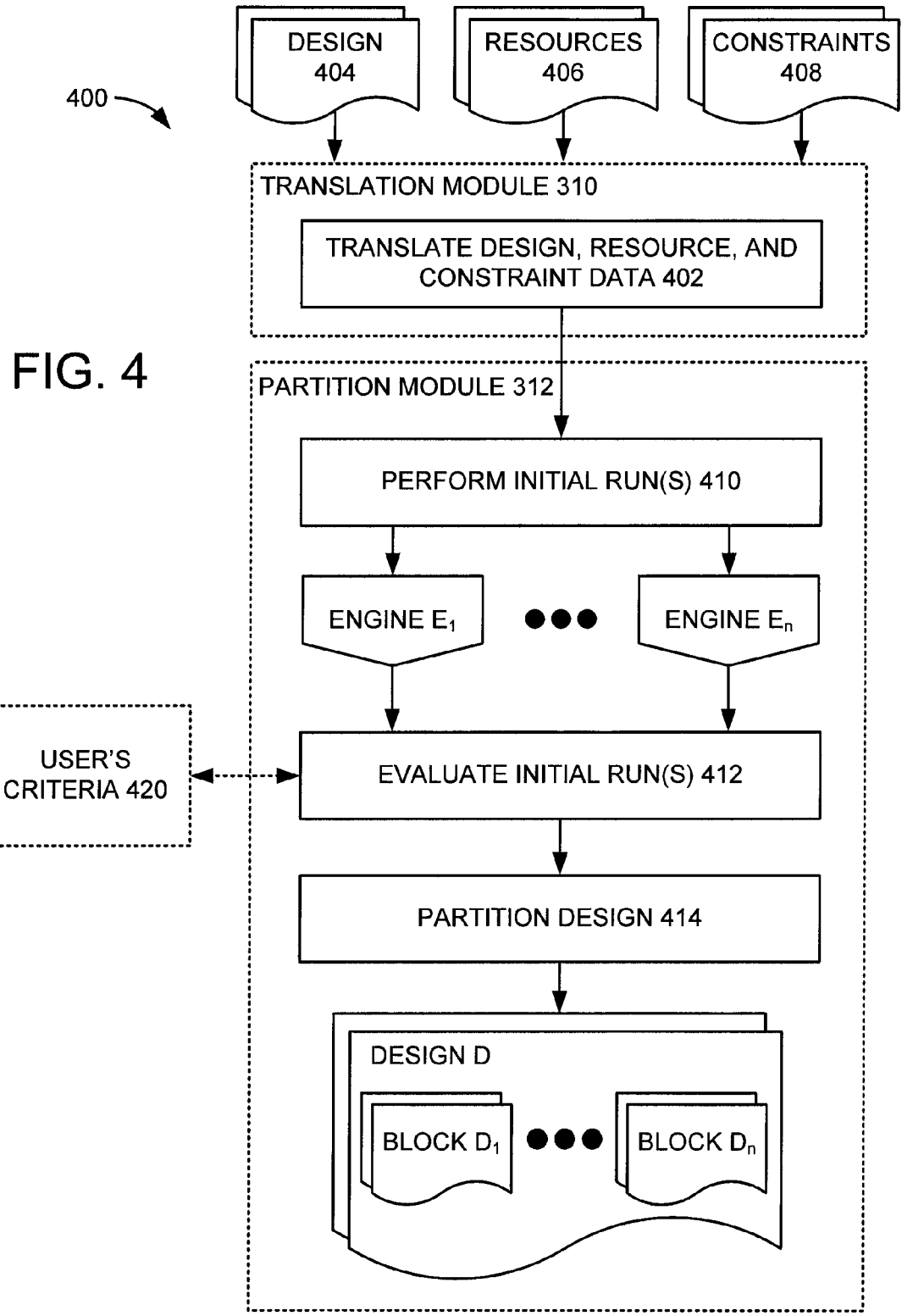
FIG. 4 is a block diagram illustrating exemplary translator and partition modules as can be used in embodiments of the disclosed technology.

As illustrated in block diagram 400 of FIG. 4, which generally shows the data received and produced by the translation module 310 and the partition module 312 as well as the representative actions performed by those modules, the translation module 310 can receive (e.g., load or buffer into memory) the design to be synthesized 404. The design 404 can comprise a circuit description in a variety of high-level hardware description languages ("HDLs"), such as SystemVerilog, Verilog, VHDL, or any other high-level circuit description or RTL language. The design 404 can also be a gate-level netlist that is to be resynthesized. Depending on the format of the design 404, the translation module 310 may not need to perform much, if any, translation. The translation module 310 can additionally include translators for receiving and translating circuit design projects from specific EDA design or synthesis tools. For example, the translation module 310 can include translators for receiving design projects (including timing constraints and attributes) from Mentor Graphics Corporation's Precision®, Modelsim®, or Leonardo® Spectrum tools, Xilinx Corporation's XST tool, or Altera Corporation's QIS tool. More generally, the translation module 310 can include translators for translating various other formats for representing a circuit design into a standard format for the synthesis tool 300. The translation module 310 can also be updated periodically (either through an automatic or manual update) to include additional translators for various other design formats.

In embodiments of the disclosed technology, the translation module 310 can also receive resource data 406 representative of the resources available to the synthesis tool 300. For example, the resource data 406 can comprise information about the number of computing resources available (e.g., information about available resources at a server farm (such as through Sun Microsystems' Sun Grid or through another load sharing facility ("LSF")). The resource data 406 can further include data concerning the type and number of any synthesis engines that are available to the tool 300, including, for example, information about the licenses to use one or more synthesis tools as well as any restrictions or constraints imposed by such tools and/or licenses. The resource data 406 may further include data concerning a time limit in which the synthesis process is to be completed.

In embodiments of the disclosed technology, the translation module 310 can also receive constraints data 408 representative of any synthesis constraints that have been identified by the user or that are otherwise associated with the design 404. For example, the translation module 300 can receive information about the constraints from a known format, such as a Synopsys Design Constraints (".SDC") file or a User Constraint File (".UCF").

At 402, the design, resource, and/or constraint data is translated. For example, the design, resource, and constraint data can be translated into a common format that can be used by the synthesis tool 300. In certain embodiments of the disclosed technology, the synthesis tool 300 provides a framework that uses a common communication protocol for receiving and sending information about a circuit design and the synthesis of the circuit design. For instance, each vendor's synthesis engine can have a separate translator that is used to interface with the synthesis tool 300. The translator can operate as a "plug-in" program that allows a synthesis engine from a third-party vendor to be registered and used within the synthesis framework provided by the synthesis tool 300. Because the synthesis tool 300 can operate using a standardized communication protocol, a third-party vendor can create and provide the necessary translator. The communication protocol should provide a standardized framework for communicating the design project, constraints, and attributes used by the synthesis tools and design tools, as well as a standardized framework for communicating results from any synthesis report generated (e.g., timing results, area results, and the like). The particulars of how translation can be performed to extract data from one format and store it in another will vary depending on the synthesis engines to be used with the synthesis tool 300, but are known in the art and can be implemented by those of ordinary skill in the art.

Any of the data that is described in relation to the translation module 310 can alternatively be input by the user (e.g., through a suitable graphic user interface). For example, a graphic user interface can be displayed to the user on a display device and allow selection of the various constraints that are to be applied during the synthesis process. Furthermore, a graphic user interface can be provided that allows a user to select from among the various resources available (e.g., which synthesis engines to use, which processing units to use).

C. Embodiments of the Partition Module

Block diagram 400 also illustrates representative actions performed by embodiments of the partition module 312. At 410, one or more initial or preliminary synthesis runs are performed. The one or more initial synthesis runs can be performed, for example, using different synthesis engines, each using their default settings, or using the same synthesis engine using different optimization settings, or a combination thereof. In FIG. 4, the synthesis engine configurations that are used to perform the initial synthesis runs are depicted as "engine $E_1$" through "engine $E_N$" and can comprise any number of configurations, including just one configuration. In some embodiments, the initial synthesis runs also involve performing a place and route procedure. Performance of a place and procedure generally produces a report having a highly accurate timing report, but can increase runtime. In other embodiments, however, other methods are used to obtain information about the performance of the design prior to place and route. For example, information about the synthesis runs can be obtained by analyzing a post-logic-synthesis report (e.g., analyzing whether the sum of cell delay on a path already exhibits negative slack), performing pre-place-and-route physical synthesis ("PPARPS") and analyzing the results (e.g., using a PPARPS technique (such as the Precision® RTL Plus tool available from Mentor Graphics Corporation) that takes into account certain physical characteristics of the target architecture and potentially some DRC), performing partial place and route (e.g., performing only placement in order to obtain timing estimates), or any combination thereof. In certain embodiments, for instance, these methods (or a subset thereof) are incrementally used to avoid full place and route, if possible. If necessary, however, place and route can be performed.

At 412, the results of the one or more initial runs are evaluated. For instance, the results can be evaluated in order to identify sections of the design (shown as "blocks") that could be improved by using a different synthesis engine configuration. With some implementations of the disclosed technology, the evaluation is performed based upon a single criterion, such as timing. In other implementations of the disclosed technology, however, the evaluation is performed based upon two or more criteria, such as estimated timing behavior, area, power consumption, the existence of embedded IP, the utilization of particular resources (e.g., memory, DSPs, LUTs, and the like) and/or other such design or performance characteristics. In certain embodiments, the evaluation criteria are provided by the user (e.g., user criteria 420 shown in FIG. 4, which can be provided through a suitable user interface) and reflect the user's optimization goals. The evaluation criteria can alternatively be provided by the user as part of the constraints data 408 that is loaded by the translation module 310. In embodiments using multiple criteria, the number of criteria can be selected by the user and/or weighted according to the user's preference. Furthermore, the criteria can take the form of specific values or constraints (e.g., a minimum frequency, a maximum area, or a maximum power usage) or of categorical criteria (e.g., timing behavior, area, or power consumption).

At 414, sections of the design that fail to meet the evaluation criteria are identified and partitioned. For instance, sections of the design that fail to meet the selected criteria can be identified and the HDL source code associated with the section modified or supplemented to demarcate the section. In one embodiment, an HDL wrapper is generated for the corresponding section. In other embodiments, an attribute is set on the module instance corresponding to the section. If the user selects a categorical criteria to evaluate the design (e.g., timing), then a fixed or user-selected number of sections can be identified according to that criteria (e.g., the n sections of the design that have the longest path delays, where n is the fixed or user-selected number).

Additionally, one or more sections of the design may be partitioned because they correspond to a proprietary IP block in the design that is desirably synthesized using a particular synthesis engine. Such sections can typically be identified from characteristic markers in the design. For instance, the HDL description of the design may contain a recognizable term in the code (e.g., a special pragma) signaling that that section is proprietary IP. The description for an IP block may also be in a clearly recognizable lower-level format. For example, the description may comprise pre-mapped (or otherwise presynthesized) technology cells. Sections of the design corresponding to proprietary IP may also be encrypted, such that it cannot be used if the recommended synthesis engine is not used. Using any of these characteristics or other such signals provided in the design, the sections of the design corresponding to proprietary IP can be partitioned at 414.

In FIG. 4, the blocks identified and partitioned at 414 are designated as "block $D_1$" through "block $D_n$", which indicates that any number of blocks can be identified and partitioned, including just one block. In some cases, results from the initial synthesis runs indicate that the user's criteria for the design were met and that no partitioning is necessary. In these cases, synthesis can still be performed for the unpartitioned design using one or more synthesis engine configurations.

To explain one embodiment of the initial run evaluation 412 and design partitioning 414 in more detail, consider an example in which the user has indicated that timing is the relevant evaluation criteria and has provided a particular timing constraint that is to be met by the synthesized design. In this example, the frequencies of the clocks in the design can be constrained across multiple domains (e.g., across all domains) during the initial synthesis runs. A timing report can be generated after a full place and route is performed (which is the most accurate report but requires long runtimes). From this timing report, a separate report or list can be created that lists the critical paths for each clock (e.g., the logic paths that exceed the timing constraint for each clock). Other techniques can alternatively or additionally be used to identify critical paths. For instance, and as more fully explained above, a post-logic synthesis report can be used, a pre-place-and-route physical synthesis technique can be performed, a partial place and route can be performed, or any combination or subcombination thereof. For each identified critical path, the portions of the circuit design that are traversed by the critical path can be identified. For instance, in one particular implementation, these portions of the circuit design comprise the hierarchical blocks that participate in a respective critical path. These portions of the circuit design can then be designated as critical timing portions (or critical timing blocks) and partitioned accordingly.

If area is selected as an evaluation criterion, one or more area critical blocks can be identified and partitioned at 412 and 414. For example, an area report can also be generated during the one or more initial synthesis runs. In general, area reports that are generated during synthesis are fairly accurate and primarily measure the number of LUTs, registers, and slices (or LABs, depending on the technology) used in the design. Typically, the number of slices correlates directly with the percentage area of the FPGA that the design occupies. In implementations that use two or more initial synthesis runs, a block-by-block comparison can be performed between the multiple runs. If the area of a block varies between the synthesis runs by some threshold amount, the block can be designated as an area critical block and partitioned accordingly.

In implementations in which timing and area are designated as evaluation criteria, if the area of a block varies between the synthesis runs by some threshold amount and if the block is not a timing critical block, the block can be identified and partitioned as an area critical block.

According to one embodiment of the disclosed technology, a partition that is created for an identified section can have one or more of the following characteristics: (1) the partition top is the same as the top module of a hierarchy block in the design; (2) two peer hierarchy blocks are in the same partition only if their common parent is selected as partition top; (3) the partition will contain all modules inside the hierarchy; and (4) modules within the hierarchy block that are not contained in the partition will be designated as "black boxes" in the partition. Additionally, when the partitions are created, one or more of the following guidelines can be used: (1) if multiple initial synthesis runs are performed and identify different critical paths, all identified critical paths can be used to generate partitions; (2) paths with negative slack should not be split into different partitions; and (3) cross-hierarchical RAM and DSP inferences should not be broken up.

D. Embodiments of the Exploration Module

Figure 5:
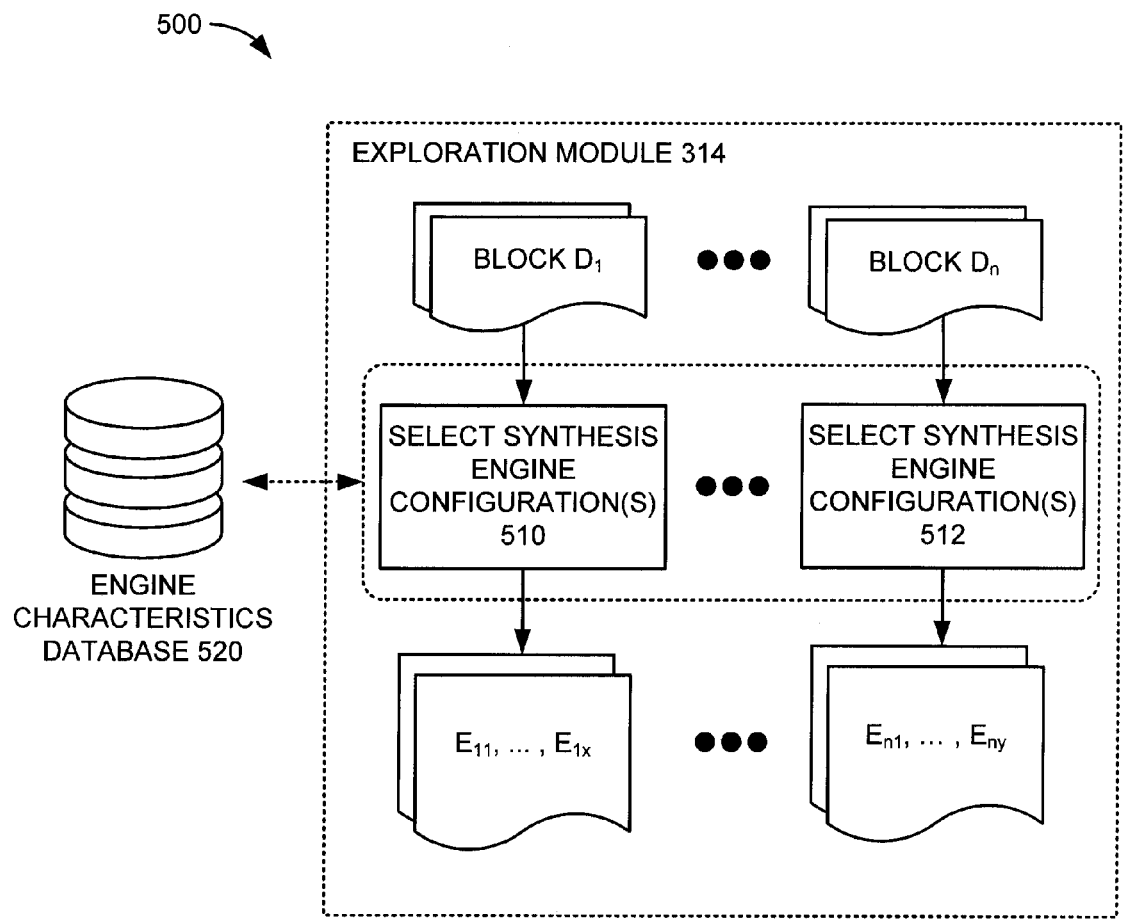
FIG. 5 is a block diagram illustrating an exemplary exploration module as can be used in embodiments of the disclosed technology.

FIG. 5 is a block diagram 500 illustrating representative actions performed by embodiments of the exploration module 314. At 510, one or more synthesis engine configurations are selected for a block identified by the partition module 312 (e.g., block $D_1$). One or more synthesis engine configurations can also be selected for any additional blocks identified by the partition module 312. For instance, at 512, one or more synthesis engine configurations are selected for block $D_n$, which represents the last of the blocks identified by the partition module 312. The ellipses in FIG. 5 indicate that the blocks between $D_1$ and $D_n$ can also have respective synthesis engine configurations selected by the exploration module. It is to be understood, however, that this notation includes the possibility that only a single block is considered (i.e., $n \geq 1$), in which case only the actions at 510 will be performed.

In FIG. 5 and throughout this disclosure, synthesis engine configurations for a block $D_a$ are designated as $E_{ab}$, where the value of "a" identifies the block and the value of "b" identifies the configuration for the block. The number of configurations for any block will vary and ranges from 1 to any positive integer. Throughout this disclosure, the upper end of similar ranges of numbers will be designated as a variable (e.g., m, n, x, y, z), which can represent any positive integer, including 1.

In certain embodiments, the user is allowed to directly select the synthesis engine configurations to use. For example, a graphic user interface can be provided that allows a user to select from among a variety of available synthesis engines and select the constraints to use during synthesis. Options can be provided to the user that allow the user to selectively override various default optimizations performed by the one or more of the synthesis tools.

In certain embodiments, the selection process 510 can be guided by evaluation criteria identified by the user (e.g., the user's criteria 420 or newly input criteria). For example, if the circuit section under consideration was identified and partitioned because it failed a timing constraint, then the selection process 510 can select one or more synthesis engine configurations that are tailored for improving the timing of the circuit section. Similarly, if the circuit section under consideration was identified and partitioned because it corresponds to proprietary IP, then the selection process 510 can select the synthesis tool recommended by the IP vendor.

A number of different techniques can be used to select the one or more synthesis engine configurations for the identified block. For example, according to one embodiment, the results from the initial runs are used to select at least one of the recommended synthesis engine configurations. For instance, if synthesis engine configurations $E_0$ and $E_1$ were used during the initial synthesis runs and if configuration $E_1$ provided a better frequency result than $E_0$, then the synthesis engine that performed $E_1$ can be selected for one of the recommended synthesis engine configurations. Additionally, the synthesis engine configuration $E_1$ can be optimized for timing by selecting a particular configuration of the synthesis engine that is tailored for timing optimizations (e.g., by setting switches that indicate the timing-oriented synthesis goals to be followed during synthesis).

In some embodiments, a database of engine characteristics 520 can be used during the selection process 510. The engine characteristics database 520 can store, for example, details of particular synthesis engine configurations (e.g., an identification of a synthesis engine along with any switch settings and/or constraints for the synthesis engine) along with information indicating the effectiveness of the respective configurations in one or more categories. For example, the categories can include the evaluation criteria by which the partitions and synthesis engine configuration selections are made (e.g., timing behavior, area, power consumption, or the source of proprietary IP). Thus, the synthesis engine configurations selected during the selection process 510 can be particularly effective at addressing the desired optimization criteria. The configurations may also be categorized in the database 520 according to the target architecture for the design (e.g., for a particular type of FPGA or for a particular FPGA vendor). Thus, the synthesis engine configurations selected during the selection process 510 can be particularly effective for designs to be implemented on particular target architectures. The intended target architecture can be included as part of the resource information received by the translation module 310 or input by the user (e.g., using a suitable graphical user interface) and selected as part of the criteria for guiding the selection process 510.

Still further, the configurations can be categorized in the database 520 according to the intended function of the circuit portion being synthesized (e.g., networking, image or video processing, audio processing, automotive processing, and so on). For example, certain synthesis engine configurations may be particularly well-suited for synthesizing circuits for image or video processing, whereas other synthesis engine configurations may be particularly well-suited for synthesizing networking circuits. Data indicating the relative suitability of a synthesis engine configuration for synthesizing a circuit design having a particular function can be stored in the engine configuration database as well. The intended function can be included as part of the resource information received by the translation module 310 or input by the user (e.g., using a suitable graphical user interface) and selected as part of the criteria for guiding the selection process 510.

Additional categories can also be included as part of the engine characteristic database 520 and used to guide the selection process 510. For example, data concerning the run time of a synthesis engine configuration, the number of available licenses to the synthesis engine configurations, and/or the memory consumption used by the synthesis engine configuration can be included in the database 520. Furthermore, information about how a synthesis engine configuration utilizes available resources (e.g., DSP blocks, LUTs, and so on) can also be included in the database 520.

Any of these categories for selecting synthesis engine configurations can be applied individually or used in combination with one another. For instance, a user may select one or more of the categories to use during the selection process (and in some implementations may weight the relative importance of each category). That is, the user may select which of the categories (or combination of categories) should be used to guide the selection process and, in some embodiments, the relative importance of each category. The user may make the selection before or after the initial synthesis run is performed. Alternatively, the identification of the engine characterization categories can be determined automatically.

The data used in the engine characteristic database 520 can be provided and updated using a variety of techniques. For example, the characteristics of the various synthesis engine configurations can be determined by performing a series of benchmark tests, gathering data over time as the synthesis tool is used, or both. For example, each time synthesis runs are performed, the engine characteristic database 520 can be updated with information derived from the resulting reports. Furthermore, the engine characteristics database 520 can be maintained locally by the operator of the synthesis tool 300 or can be maintained as a master database by the EDA software vendor supporting the synthesis tool 300. In this case, the engine characteristic database may be stored in a server that is accessed by multiple client computers using the synthesis tool 300 (e.g., multiple client computers operated by a single entity or multiple client computers operated by multiple, unrelated entities). The master database can be updated periodically using results obtained from multiple users and/or licensees of the synthesis tool 300.

As noted, the user can identify the criteria to be used during the selection process 510. In some embodiments, the user can also indicate that the synthesis tool 300 should continue to explore various synthesized net lists until a particular performance target is reached, until the user chooses to stop the synthesis tool, and/or until a certain run time has been reached. For instance, the user can choose to operate the synthesis tool 300 in a "constraint mode" in which one or more performance targets are set (e.g., a timing, area, or power target) and synthesis continues until the one or more targets are reached by the synthesized design. Or the user can choose to operate the synthesis tool 300 in a "benchmark mode" in which synthesis is iteratively performed until the user stops the synthesis tool 300 or a selected run time is reached or results can no longer be improved iteratively.

As illustrated in FIG. 5, the results from selecting synthesis engine configurations at 510, 512 are lists of the selected configurations (designated as "$E_{11}$" through "$E_{1x}$" and "$E_{n1}$" through "$E_{ny}$"). The number of configurations selected can vary, and may be limited (e.g., to a fixed maximum or to a maximum that is dependent on the resources available to the synthesis tool).

Figure 16:
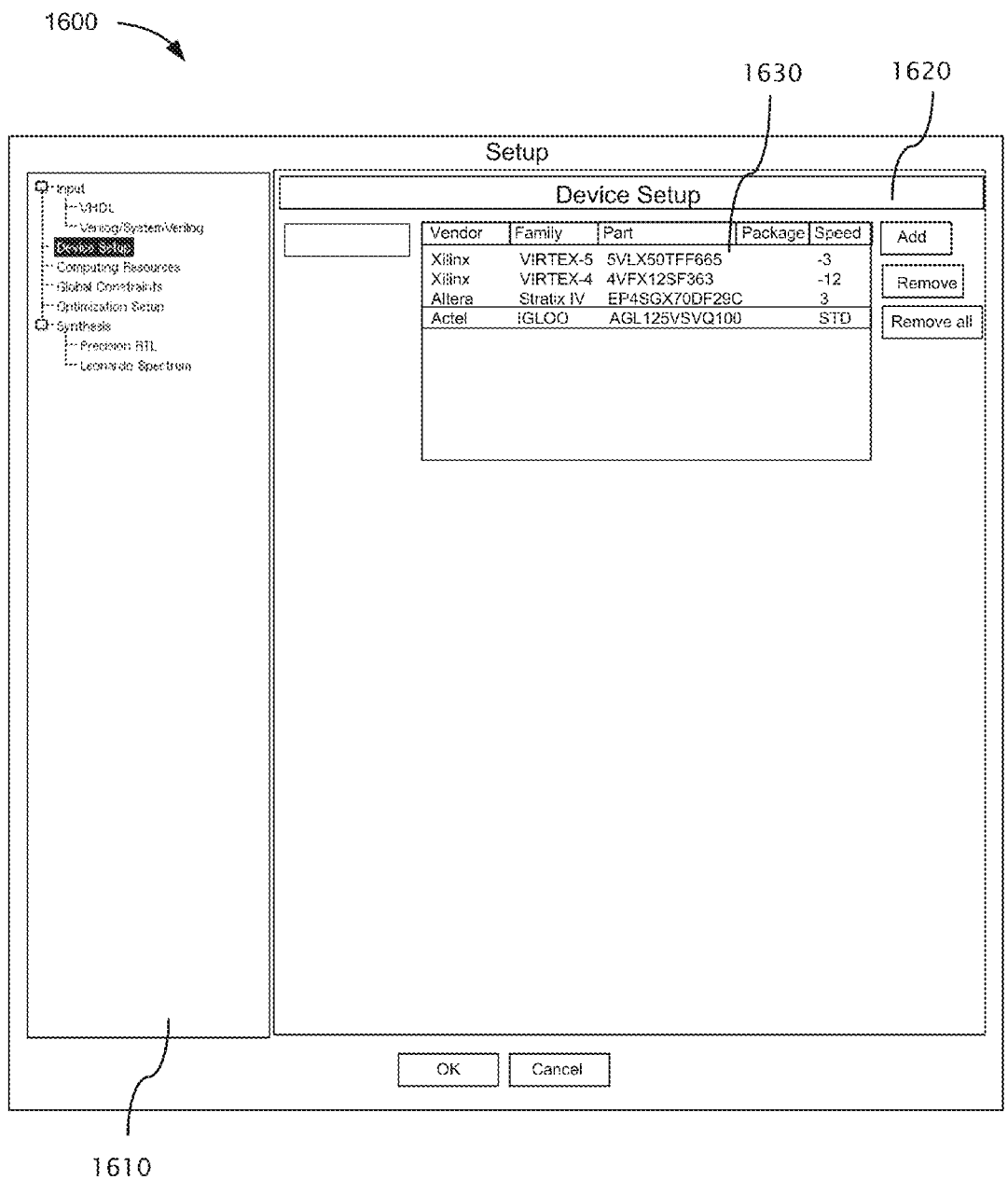
FIG. 16 is a screenshot of a first exemplary graphic user interface as can be used to perform aspects of the exploration module.

FIG. 16 is a screenshot of an exemplary graphic user interface 1600 to implement aspects of the exploration module 314 according to certain embodiments of the disclosed technology. In particular, graphic user interface 1600 allows a user to select which target architecture the design is to be synthesized for. Graphic user interface 1600 includes a navigation window 1610 that allows a user to select from among different windows that control the synthesis tool 300 and allow, in many instances, for user input. A device setup window 1620 includes a list 1630 of the possible target architectures for which the synthesis tool 300 can perform synthesis. The list 1630 can show a variety of information for each target architecture (or device), but in the illustrated embodiment shows the vendor name, the family to which the device belongs, the part number, the package type, and the speed designation (typically given by the manufacturer). Devices can be selected by the user pointing to the desired device, selecting it (e.g., with a mouse click), and then selecting the "add" button. Devices can be deselected by the user pointing to the device to be deselected, selecting it, and then selecting the "remove" button. The user can also deselect all devices by selecting "remove all." Additional devices can be added to the list through the illustrated device setup window 1620 as well. For instance, the user can add a new device by selecting the "load from file" button, and either directing the synthesis tool 300 to an appropriate resource file or inputting the information about the new resource manually. In the illustrated screen shot, the Xilinx, Virtex-4, 4VFX12SF363, is selected and the Actel, IGLDO, AGL125V5VQ100 is highlighted and may be selected or deselected by the user.

Figure 17:
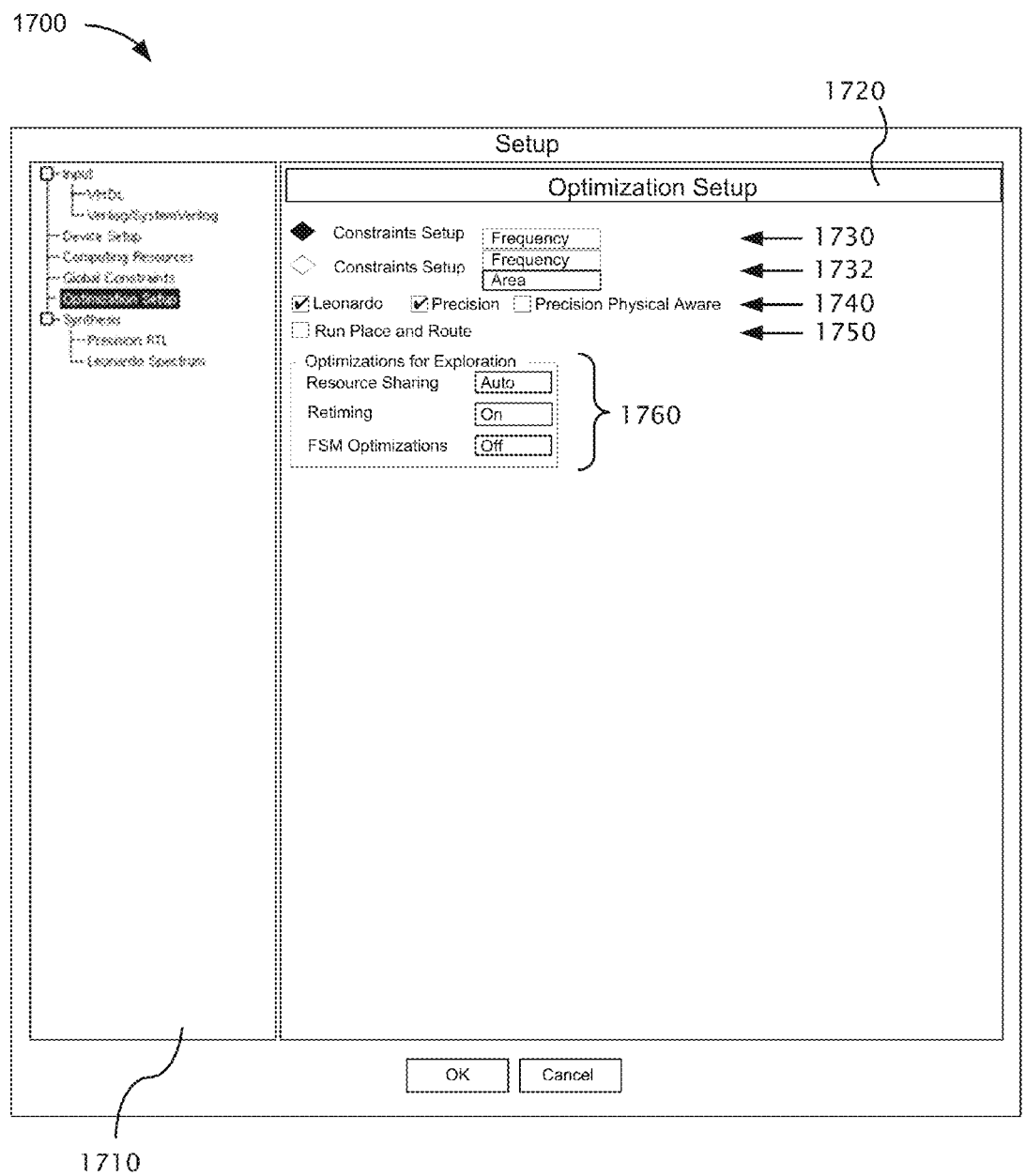
FIG. 17 is a screenshot of a second exemplary graphic user interface as can be used to perform aspects of the exploration module.

FIG. 17 is a screenshot of an exemplary graphic user interface 1700 to implement other aspects of the exploration module 314 according to certain embodiments of the disclosed technology. In particular, the graphic user interface 1700 allows a user to control the synthesis engine configurations selected by the exploration module 314. As with graphic user interface 1600, the graphic user interface 1700 includes a navigation window 1710 that allows a user to select from among different windows that control the synthesis tool 300. An optimization setup window 1720 allows a user to select either the constraint mode by selecting the constraint setup option 1730 or the benchmark mode by selecting the benchmark setup option 1732. For example, in the illustrated implementation, the constraints setup option 1730 allows a user to select either frequency (a type of timing performance) or area as the relevant criteria for guiding synthesis engine configuration selection. The actual constraint to be used as the target for the synthesis can be input by the user in another window (not shown). In the illustrated interface 1700, the user can also choose which synthesis engines should be used to implement the synthesis runs in a synthesis engine selection area 1740. Although only three synthesis engines are shown, the number of synthesis engines will typically vary depending on how many are supported by the particular implementation of the tool and how many are licensed by the user. The graphic user interface 1700 also includes a place-and-route selection area 1750 where the user can choose to perform place and route during the ensuing synthesis runs. Performing place and route will typically increase the run times, but allow more accurate performance reports to be generated. The illustrated interface 1700 additionally includes an optimization selection area 1760 in which various synthesis optimizations can be manually selected by the user. In particular, in the optimization selection area 1760, the user can control the synthesis engine configurations that are selected by indicating whether the selected configurations should have certain synthesis optimizations activated ("on"), deactivated ("off"), or selected automatically by the particular synthesis tool. The number and type of synthesis optimizations that can be selected by the user will vary from implementation, but in the illustrated implementation comprise synthesis settings enabling resource sharing, retiming, and finite-state machine ("FSM") optimizations. Furthermore, although optimization selection area 1780 is shown as applying the user selections to all activated synthesis engines, the optimization selection area can allow for adjustment of individual synthesis engines in certain embodiments.

Figure 18:
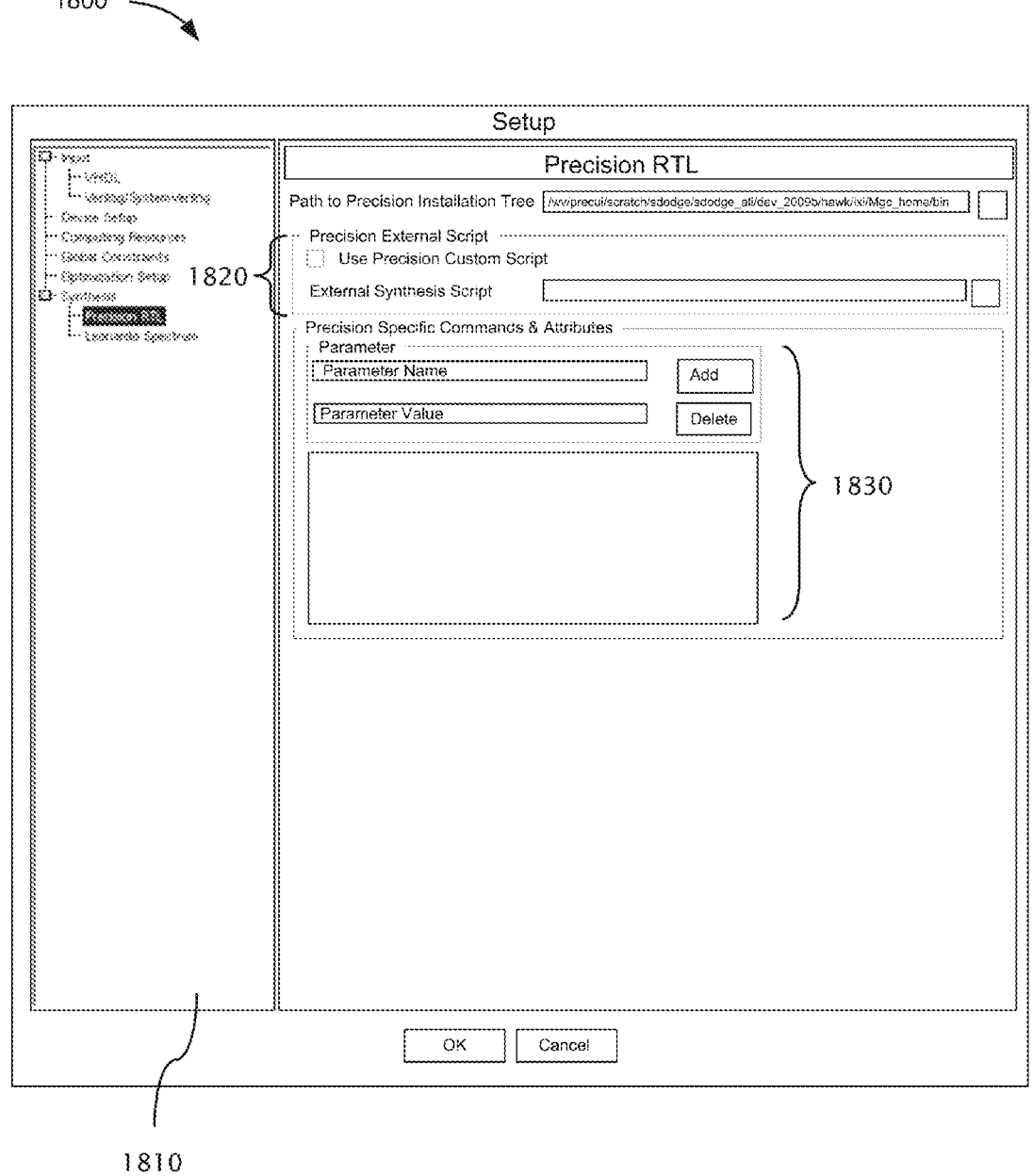
FIG. 18 is a screenshot of a third exemplary graphic user interface as can be used to perform aspects of the exploration module.

FIG. 18 is a screenshot of an exemplary graphic user interface 1800 to implement additional aspects of the exploration module 314 according to certain embodiments of the disclosed technology. In particular, graphic user interface 1800 allows a user to provide synthesis engine specific commands for use with a particular synthesis engine configuration. As with graphic user interface 1600, graphic user interface 1800 includes a navigation window 1810 that allows a user to select from among different windows that control the synthesis tool 300. Here, the navigation window 1810 further allows a user to select which particular synthesis engine is to be specifically controlled. Because synthesis tools vary widely in their available optimization settings, the graphic user interface 1800 is an example of an interface that allows a user to choose a particular configuration using a synthesis tool's unique scripts or command structure. In the illustrated embodiment, the interface 1800 is adapted for Mentor Graphics' Precision® RTL synthesis tool. The interface 1800 includes a script input area 1820 in which a user can supply a particular script used to control the synthesis engine by selecting the "use precision custom script" box and inputting the custom script in the window provided. The interface 1800 also includes a command and attribute area 1830 in which particular commands and attributes can be provided by the user. For instance, the user can select a particular parameter in the parameter window provided and the value of the parameter in the parameter value window provided. Once input, the user can select the add button to add the parameter and value to the selected synthesis engine configuration.

E. Embodiments of the Synthesis Module

Figure 6:
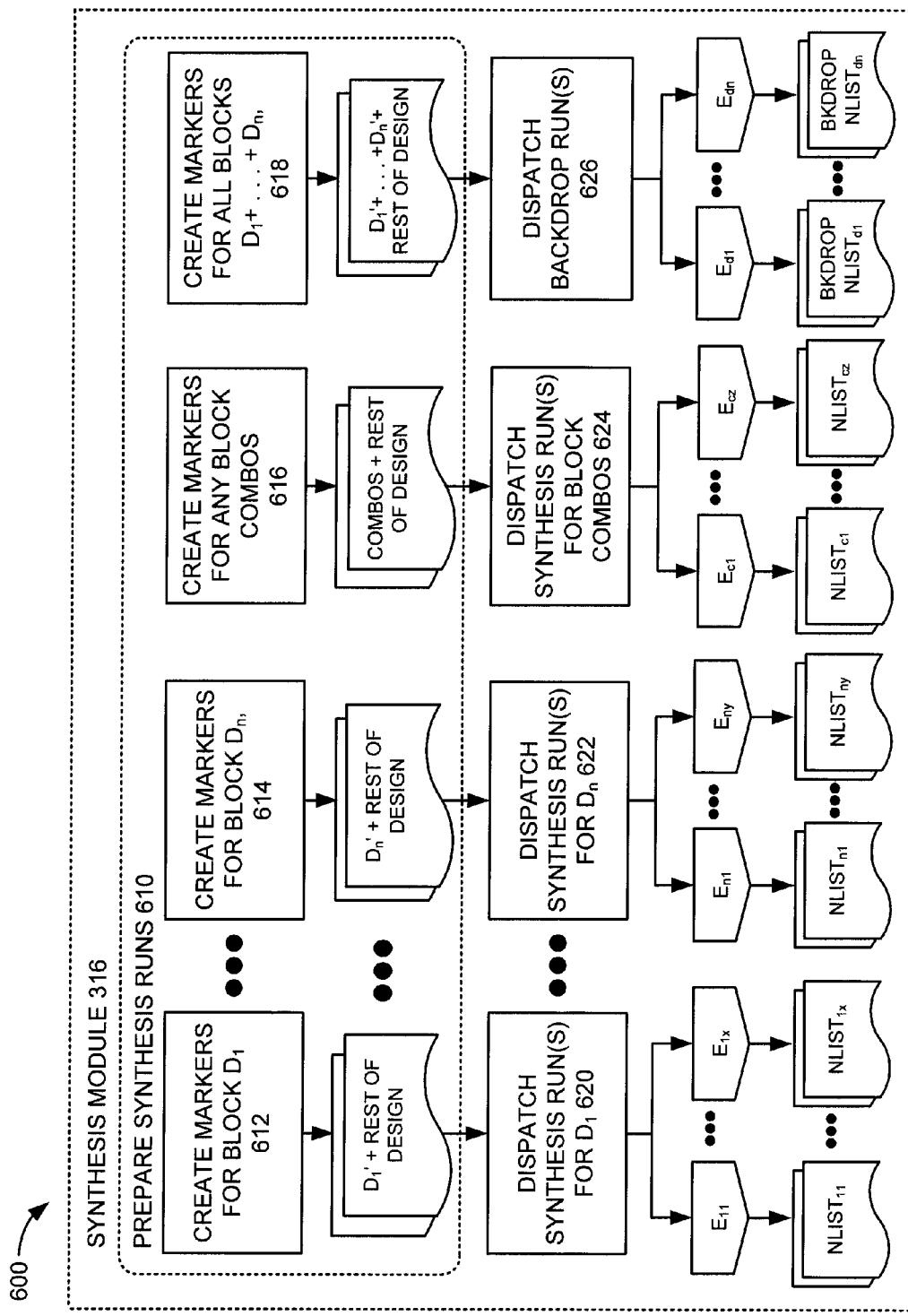
FIG. 6 is a block diagram illustrating an exemplary synthesis module as can be used in embodiments of the disclosed technology.

FIG. 6 is a block diagram 600 illustrating actions performed by embodiments of the synthesis module 316. In general, the synthesis module 316 prepares and dispatches the various synthesis runs identified by the exploration module 314, thus generating multiple netlists that are optimized for each identified section and that can be used in assembling a final netlist.

At 610, the synthesis runs using the synthesis engine configurations selected by the exploration module 314 are prepared for the partitioned sections of the design. For example, as illustrated at 612 and 614, markers or indicators can be generated for the synthesis runs selected for blocks $D_1$ through $D_N$. In general, the markers that are generated allow the identified sections of the design to be recognized and separately manipulated in the resulting netlist. For instance, in particular embodiments, the markers allow the interfaces to a particular section (e.g., the inputs/outputs) to be preserved during synthesis so that the interfaces will appear in the resulting netlist and allow the corresponding section to be easily moved (or copied) into another netlist for the design. In other words, the section marking process allows a partitioned section of the design to be easily isolated and interchanged in the resulting netlist without impacting the time, area, or other optimizations that desirably occur to the partitioned section during the synthesis process. At 616, markers are created for any combination of blocks that had one or more of the same synthesis engine configurations selected by the exploration module 314. For example, if the exploration module 314 selects synthesis engine configurations $E_1$ and $E_2$ for block $D_1$ and configurations $E_2$ and $E_3$ for block $D_2$, then configuration $E_2$ targets both block $D_1$ and $D_2$. Rather than running two separate synthesis runs for blocks $D_1$ and $D_2$ using configuration $E_2$, a single synthesis run can be performed on a design that includes markers for both $D_1$ and $D_2$. The generation of any such block combination markers is performed at 616. Alternatively, separate synthesis runs can be performed for any of the blocks that had the same synthesis engine configuration selected by the exploration module.

The section marking process can be performed using a variety of different techniques. For example, in the illustrated embodiment, markers are inserted into the original high-level description of the circuit design at locations corresponding to the identified section, but the remainder of the high-level description is left intact. Thus, the file that remains after the marking process represents the full design with modifications to the partition for which the synthesis run is targeted (e.g., the files "$D_1$'+ rest of design" and "$D_n$'+ rest of design" shown in FIG. 6).

Using the full design in a synthesis run allows the exploration of different netlist implementations while avoiding downstream resource management and constraint management issues. For example, running the partitions in the context of the entire design can help avoid overmapping problems that might occur if the partitions are synthesized separately and combined later. Further, by running the partition in the context of the entire design, the original design constraints can be used, eliminating any need for any constraint partitioning. Additionally, black boxes, which are not handled well by all synthesis tools, can be more easily handled.

In order to provide a partitioned netlist into which the various optimized netlist portions can be assembled, a so-called "backdrop" netlist can also be created by the synthesis module 316. To prepare the backdrop netlist, a design with markers inserted for all identified sections can be created at 618. This backdrop design (shown as "$D_1$'+ . . . +$D_n$'+ rest of design" in FIG. 6) can then be used to perform the one or more backdrop synthesis runs.

In certain embodiments, the markers that are inserted into the original design comprise commands used for incremental or block-based synthesis flows. When using existing incremental synthesis commands, however, it is possible that certain optimizations (e.g., constant propagation, dead logic remove, and other such optimizations) within a block will be prevented. Accordingly, in certain embodiments of the disclosed technology, an HDL wrapper is used that contains the incremental commands, instantiates the block, and connects the block inputs and outputs to constants or unconnected nets based on how the block is instantiated in the actual design. This preserves the block interface while also allowing desired optimizations to occur. In these embodiments, information about constant or unconnected inputs/outputs can be gathered during the initial synthesis runs. In addition, the wrapper can be used to provide a way to name-wrap complex interface types (e.g., VHDL records) between different tools, thus creating a consistent interface between the synthesis tools that provide the various synthesis engines.

In one particular embodiment, an HDL wrapper is created by making one or more of the following modifications to the high-level description of the partition targeted by the synthesis run: (1) the instance of the partition top is changed to an instance of a wrapper; (2) the original constraints are modified to account for the extra hierarchy of the wrapper; and (3) so-called "hard_hierarchy" constraints are added to the partition tops and black-boxes so that they can be swapped out of the netlist. In general, the resulting wrapper will have the same interface as the partition top and will instantiate the partition top with the required generics, constants, and unused outputs. The wrapper will therefore allow cross-boundary optimizations to occur during the synthesis process. For example, to enable constant propagation and dead logic removal across the partition top, the partition inputs can be connected to the recorded constant, unused partition outputs can be left unconnected, and undriven wrapper outputs can be connected to zero. As noted, information regarding the need for constant propagation can be obtained from the initial synthesis runs (e.g., by analyzing the post-compile netlist or schematic).

In other embodiments, one or more synthesis runs can be prepared in which only the corresponding portions of the high-level circuit description are used. For example, instead of performing synthesis in the context of the entire design, any of the synthesis runs can be performed for just the portion of the high-level description that corresponds to an identified circuit section. In these embodiments, further constraints might be included to account for the potential resource management problems that might occur (e.g., the synthesis runs might include appropriate constraints on the number of resources available).

At 620, 622, and 624, synthesis runs are dispatched for the identified blocks (blocks $D_1$ through $D_n$ in FIG. 6) using the synthesis engine configurations identified by the exploration module 314 and using the modified designs created at 612, 614, and 616. The one or more synthesis runs that are performed for each respective block are designated in FIG. 6 as "$E_{11}$" through "$E_{1x}$" for the block $D_1$ synthesis runs, and "$E_{n1}$" through "$E_{ny}$" for the block $D_n$ synthesis runs. These synthesis runs generate respective netlists "$nlist_{11}$" through "$nlist_{1x}$" for block$_1$ and "$nlist_{n1}$" through "$nlist_{ny}$" for block $D_n$. Additionally, in certain embodiments, constraints files are also generated by the synthesis runs. The constraints files can be used during any subsequent place and route procedure.

As noted above, the exploration module 314 may have selected the same synthesis engine configuration for two or more different blocks. In this case, a single synthesis run using the identified synthesis engine configuration can be performed using the design generated at 616 that combines the two or more different blocks. There may exist multiple such overlapping selections across multiple various combinations, all of which are intended to be encompassed by the synthesis runs "$E_{c1}$" and "$E_{cz}$" and their resulting netlists "$nlist_{c1}$" and "$nlist_{cz}$" shown in FIG. 6.

Additionally, at 626, one or more backdrops runs can be dispatched using the backdrop design generated at 618. These backdrop runs are designated in FIG. 6 as "$E_{d1}$" through "$E_{dn}$" and generate backdrop netlists "bkdrop nlist$_{d1}$" through "bkdrop nlist$_{dn}$." In particular embodiments, the backdrop runs are performed using different synthesis engine configurations than the other synthesis runs and are designed to optimize the remainder of the design according to different criteria. Thus, for example, if the sections identified by the partition module 312 are synthesized using synthesis engine configurations optimized for improving timing, the backdrop runs may be synthesized using synthesis engine configurations optimized for area, or vice versa. As shown, multiple backdrop synthesis runs can be performed in order to provide multiple results from different synthesis engine configurations.

To dispatch the synthesis runs, the synthesis module 316 can use the information obtained by the translation module 310 about the available resources—including, for example, the speed and number of processing resources available (e.g., in a server farm)—and can also use information about the expected run time of each synthesis engine configuration. Alternatively, information about the available resources to use during synthesis can be provided by the user through a suitable graphic user interface (e.g., graphic user interface 1900 show below). Based on this information, the synthesis module 316 may limit or alter the synthesis runs selected by the exploration module 314 (e.g., in order to complete the synthesis runs within a desired time limit).

Figure 19:
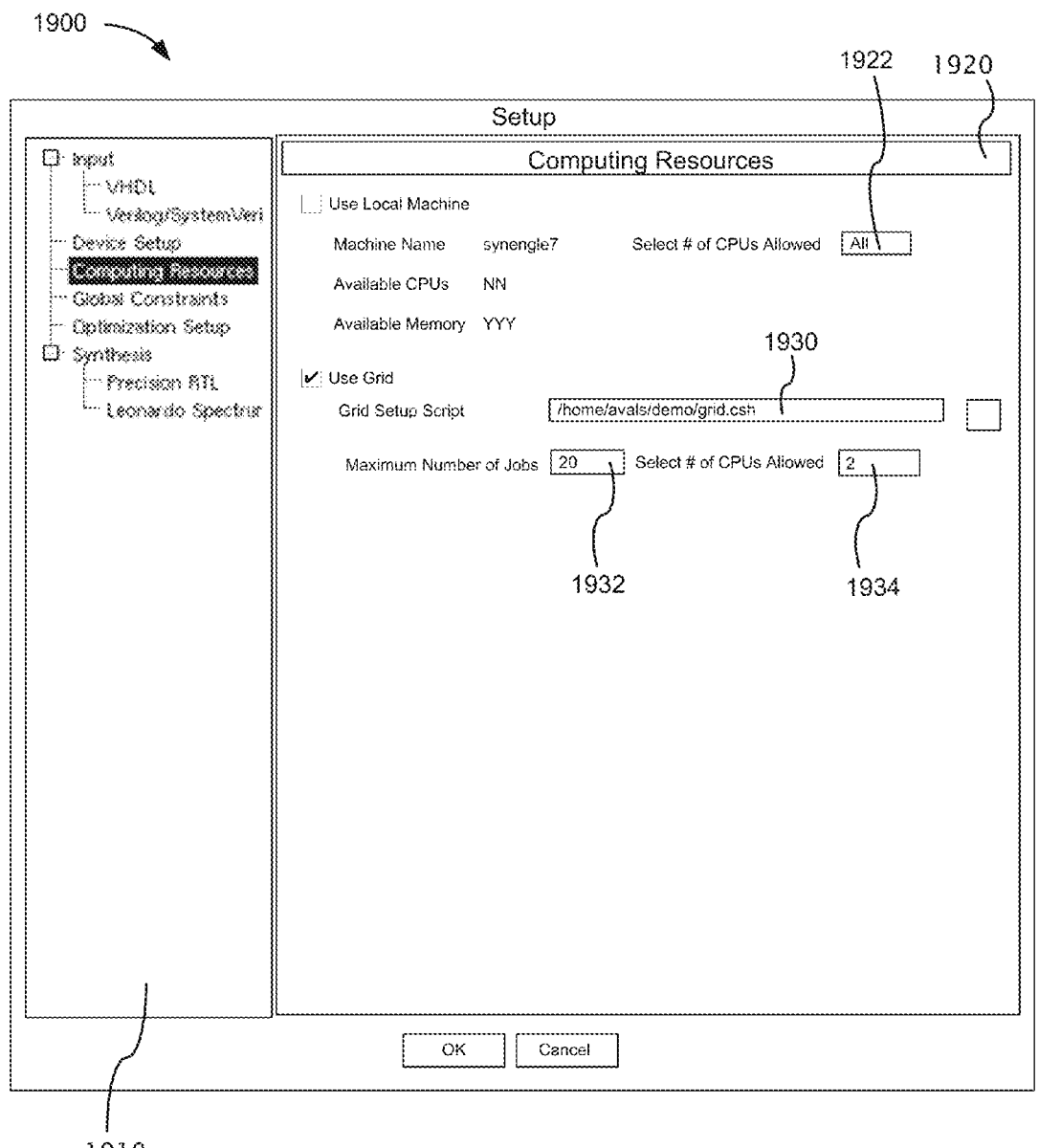
FIG. 19 is a screenshot of a first exemplary graphic user interface as can be used to perform aspects of the synthesis module.

FIG. 19 is a screenshot of an exemplary graphic user interface 1900 for implementing aspects of the synthesis module 316 according to certain embodiments of the disclosed technology. In particular, graphic user interface 1900 allows a user to provide information about the computing resources to use during the synthesis runs. As with graphic user interface 1600, graphic user interface 1900 includes a navigation window 1910 that allows a user to select from among different windows that control the synthesis tool 300. Computing resource selection area 1920 allows a user to select the local machine or a grid for performing the synthesis runs. Other computing resources may be available for user selection depending on the implementation. If the local machine is selected for use by the user, then a CPU limit window 1922 can be used by the user to select the number of CPUs allowed to be used for the synthesis runs if the local machine is a multi-CPU machine. If a grid is selected for use by the user, then a setup script can be provided by the user in a grid-setup window 1930. Additionally, in the illustrated interface 1900, the user can set a maximum number of synthesis runs to be performed using a maximum job number window 1932. Furthermore, the user can similarly limit the number of CPUs that are allowed to be used during the synthesis runs in a CPU limit window 1934.

F. Embodiments of the Evaluation Module

Figure 7:
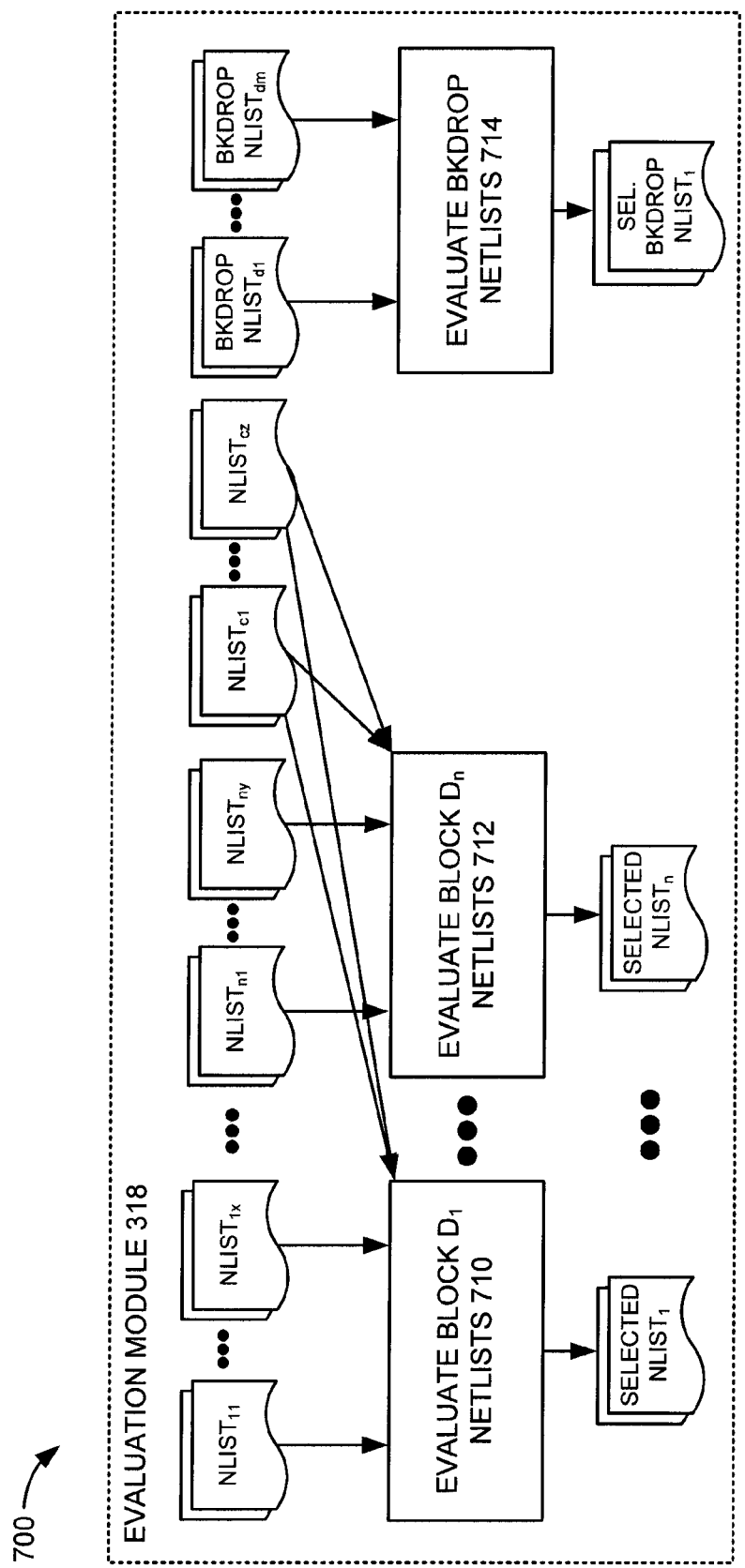
FIG. 7 is a block diagram illustrating an exemplary evaluation module as can be used in embodiments of the disclosed technology.

FIG. 7 is a block diagram 700 illustrating representative actions performed by embodiments of the evaluation module 318. In general, the evaluation module 318 evaluates the netlists produced by the synthesis runs and selects a netlist for each identified circuit section. At 710 and 712, the netlists generated by the synthesis runs targeting blocks $D_1$ through $D_n$ are evaluated. For each targeted block, a single respective netlist can be selected (designated in FIG. 7 as the "selected nlist$_1$" through "selected nlist$_n$"). Using block $D_1$ as an example, the netlists considered at 710 will typically comprise all netlists generated by synthesis runs that targeted block $D_1$ (e.g., netlists "nlist$_{11}$" to "nlist$_{1x}$"), including any synthesis runs that may have targeted additional blocks as well (e.g., any of "nlist$_{c1}$" to "nlist$_{cz}$" that were produced from synthesis runs targeting block $D_1$ in addition to any other blocks). Additionally, at 714, the netlists generated by the backdrop synthesis runs are evaluated and a single backdrop run selected (designated in FIG. 7 as "sel. bkdrop nlist$_1$"). In embodiments for which only a single synthesis run is performed for any of the identified blocks or for the backdrop run, then the evaluation and selection processes 710, 712, 714 can be bypassed.

The evaluation and selection processes of 710, 712, 714 can be performed according to a variety of different techniques. The evaluation and selection can be made, for example, based on the criteria originally used by the partition module 312. Alternatively, and as more fully explained below, the user may select different criteria for evaluating the netlists (e.g., using a suitable graphical user interface). The selection can be based, for example, on estimated timing behavior, area, power consumption, or other such design or performance criteria. Furthermore, the selection can be based on any combination or subcombination of these criteria (e.g., using user-selected criteria and weights). Additionally, the criteria can change depending on the block for which the netlists were generated.

In particular embodiments, the evaluation module 318 focuses only on performance or design improvements to the particular section of the circuit for which the synthesis run was targeted. Thus, for example, a particular synthesis run result may be discarded because the desired improvements were not seen in the resulting netlist for the identified section, even though the design might elsewhere exhibit desirable improvements. In other embodiments, improvements to the design as a whole are considered by the evaluation module 318 (e.g., as a weighted factor).

If multiple backdrop runs are performed, the evaluation module 318 can select from among the resulting netlists based on criteria that is different than that used for the identified blocks (e.g., if the synthesis runs for one or more of blocks $D_1$ to $D_N$ targeted timing, the criteria for selecting the backdrop netlist can be area, or vice versa). During this evaluation process, the evaluation module 318 can focus its evaluation just on the remaining portion of the design that does not include the sections identified by the partition module 312.

As noted above, there may be situations in which no circuit sections are identified by the partition module 312. In these situations, the evaluation module 318 as well as the assembly module 320 can be bypassed.

The information used to perform the evaluations and selections at 710, 712, and 714 can be obtained from the synthesis tools that were used to perform the synthesis runs. For example, the timing reports and area reports that are generated by the various synthesis engine configurations can be used. In some embodiments, place and route can be performed in order to provide more detailed information. In other embodiments, however, place and route is not performed unless necessary. In these embodiments, timing reports may be generated using other timing estimation techniques. For instance, and as more fully explained above, a post-logic synthesis report can be used, a pre-place-and-route physical synthesis technique can be performed, a partial place and route can be performed, or any combination thereof. The various synthesis results and/or reports generated by the different synthesis tools can be translated so that the results can be assembled and analyzed in a common format (e.g., according to a standardized communication protocol used by the synthesis tool 300).

In some embodiments of the disclosed technology, the evaluation and selection processes 710, 712, 714 are performed automatically based on the criteria provided earlier in the flow. In other embodiments, however, the criteria for selecting from among the resulting netlists can be newly selected by a user. For example, the results of the synthesis runs (or summaries of the results) for one or more of the partitioned circuit sections can be displayed to the user in a suitable graphic user interface. The graphic user interface can additionally allow the user to modify the criteria by which the selection is to be made (e.g., by drop-down menu, adjusting weights, and so on). The results of the synthesis runs can then be sorted according to the modified criteria and displayed in the order to the user. This provides the user the ability to more fully explore the various implementation possibilities.

G. Embodiments of the Assembly Module

Figure 8:
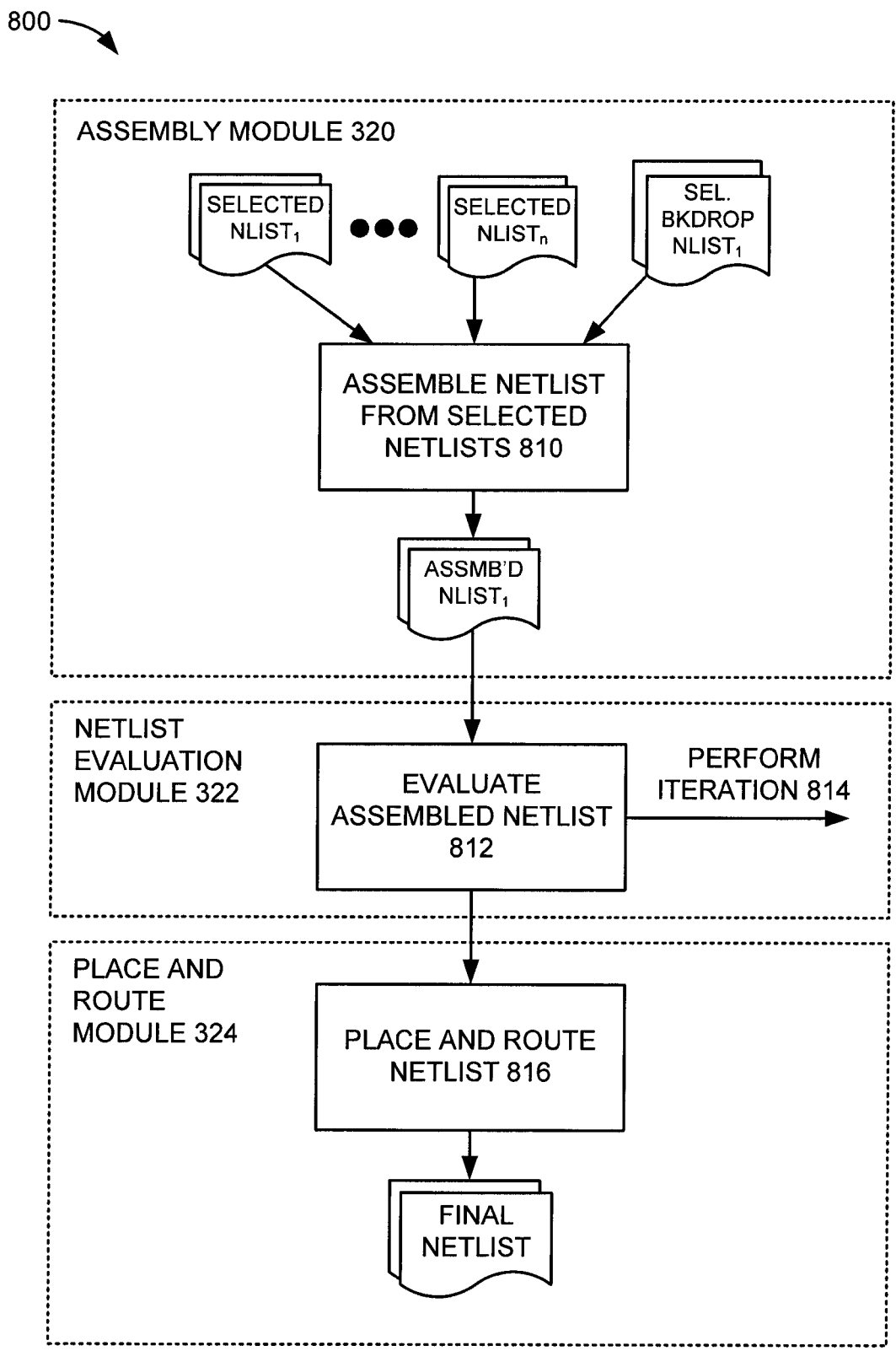
FIG. 8 is a block diagram illustrating exemplary assembly, netlist evaluation, and place and route modules as can be used in embodiments of the disclosed technology.

FIG. 8 is a block diagram 800 illustrating representative actions performed by embodiments of the assembly module 320. At 810, the assembly module 320 combines the netlists selected by the evaluation module 318 into a single netlist. For example, in the illustrated embodiment, "selected netlist$_1$," as well as any additional netlists selected by the evaluation module 318 (e.g., up to and including "selected netlist$_n$,") are used to replace portions of the background netlist "sel. bkdrop nlist$_1$". In particular implementations, the markers inserted by the synthesis module 316 preserve the input and outputs to the partitioned circuit sections during synthesis. As a result, the portions of the selected netlists corresponding to the partitioned circuit sections can be identified and cleanly separated from the remainder of the netlist. In addition, because the backdrop synthesis run for the selected backdrop netlist was performed on a design having markers for each of the partitioned circuit sections, the locations in the backdrop netlist corresponding to the partitioned circuit sections can be easily identified and replaced by the appropriate portions of the selected netlists. In this fashion, a netlist (designated in FIG. 8 as "assmb'd nlist$_1$") can be formed that includes netlist sections synthesized using the best available synthesis tool and synthesis tool configuration for that particular section and according to the user's particular design objectives.

In certain embodiments, the netlist sections are modified somewhat so that there are no conflicts for modules shared among partitions or between partitions and the rest of the design. For example, in one particular embodiment, a partition-specific prefix is added to each module (except to the partition wrapper top and techcells). The partition specific prefix helps ensure that no naming conflicts exist between partitions. Additionally, the partition specific prefix helps handle different names generated by different engines for generics or parameterized blocks.

H. Embodiments of the Netlist Evaluation Module

Block diagram 800 of FIG. 8 also illustrates representative actions performed by embodiments of the netlist evaluation module 322. In general, the netlist evaluation module 322 evaluates whether other performance aspects of the design were adversely affected during the synthesis process, thereby creating previously unknown problems. At 812, for example, the assembled netlist is evaluated against one or more criteria. For example, the assembled netlist can be evaluated according to the original criteria used by the partition module 312, such as estimated timing behavior, area, power consumption, or other such design or performance criteria. To perform this evaluation, the assembled netlist may be resynthesized and new timing reports and area reports generated.

This evaluation procedure can be performed automatically or by displaying a report to the user. If the desired criteria are not met, an iteration of the synthesis process can be performed at 814 (e.g., beginning with the exploration module and the selection of synthesis engine configurations for one or more of the partitioned blocks of the design). During any iteration, the assembled netlist (or any portion thereof) can be used as the original design that is considered. Alternatively, the previously considered design can be used again, but the optimization criteria modified so as to prevent the adverse performance results from reappearing.

Additionally, in certain embodiments, information from the previous synthesis runs can be used during any iteration that is performed. For example, the synthesis engine configurations selected during any iteration can be based on one or more of the synthesis engine configurations from the previous iteration. The synthesis engine configurations selected can thus comprise slightly modified versions (e.g., using slightly different synthesis constraints or settings) of the best performing one or more synthesis engine configurations from the previous iteration (e.g., the best n synthesis engine configurations, where n is a preset or user-defined number). In this way, more finely-tuned synthesis optimizations can be explored during a subsequent iteration.

Data concerning the synthesis engine configurations selected during any iteration and the resulting performance of the synthesis engine configuration for a particular design can be stored in the engine characteristic database discussed above. In this way, the synthesis tool 300 can be "self-learning" and produce improved synthesis results during subsequent iterations.

If the desired criteria are met, the final netlist can proceed to the place and route module 324. In some embodiments, a place and route procedure is performed before the final netlist is evaluated. Thus, the place and route module 324 shown in FIG. 8 may be called before the netlist evaluation module 322.

I. Embodiments of the Place and Route Module

Block diagram 800 of FIG. 8 also illustrates representative actions performed by embodiments of the place and route module 324. In particular, at 816, a place and route is performed on the assembled netlist. Typically, the place and route that is performed is technology specific and uses the place and route tool provided by the vendor of the target architecture. For instance, if the particular FPGA device for which the design is targeted is known, then that vendor's specific place and route tool can be used.

J. Assembly-Free Synthesis

In certain embodiments of the disclosed technology, any of the synthesis runs that are performed using the selected synthesis engine configurations can be modified to avoid any post-synthesis assembly. For instance, the backdrop netlist can be generated before the netlists for one or more of the identified sections of the design are generated. Portions of the backdrop netlist can then be used during preparation of the synthesis runs for an identified circuit section to replace those portions of the high-level circuit description that do not correspond to the targeted circuit section. In other words, the design that is synthesized by a particular synthesis engine configuration can include a high-level circuit description corresponding to the targeted section of the circuit design and a gate-level netlist corresponding to the remainder of the circuit design. The synthesis that is performed can then convert the high-level circuit description to a gate-level netlist using the selected synthesis engine configuration without modifying the netlist for the remainder of the design. The resulting netlist therefore automatically incorporates the backdrop netlist. This alternative synthesis procedure addresses the fact that many vendor's synthesis tools do not allow their resulting netlists to be freely accessed and manipulated.

Furthermore, the overall synthesis flow for embodiments of the synthesis tool can be modified such that this assembly-free synthesis can be performed for one or more of the synthesis runs. For example, the overall flow can be modified such that some of the synthesis runs produce netlist portions that are evaluated and assembled as explained above, whereas other synthesis runs are assembly free. An additional evaluation stage for evaluating and selecting netlists from any assembly-free synthesis run can be included in the synthesis process.

Figure 9:
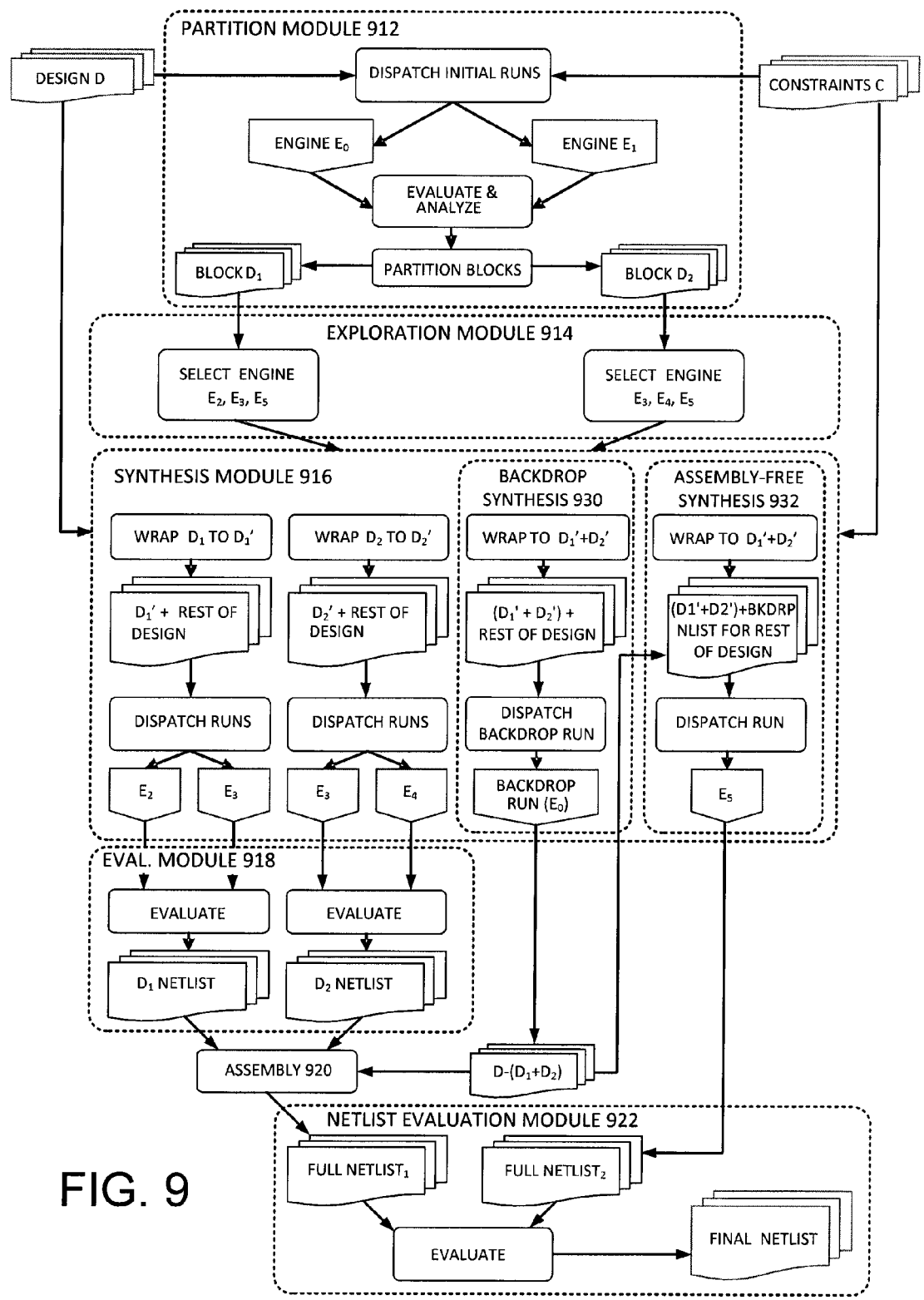
FIG. 9 is a block diagram illustrating an exemplary synthesis flow in which assembly-free synthesis is performed according to embodiments of the disclosed technology.

FIG. 9 illustrates one exemplary embodiment of a synthesis tool 900 that incorporates an assembly-free synthesis run. Furthermore, FIG. 9 illustrates how the synthesis tool 900 might synthesize a particular high-level description of a design D into a final netlist. Unless otherwise stated, the particular modules shown in FIG. 9 can operate in accordance with any of the methods and features described in the previous sections.

As shown, the partition module 912 performs two initial synthesis runs using synthesis engine configurations $E_0$ and $E_1$. The partition module 912 also evaluates the results of the synthesis run according to one or more criteria and identifies sections of the circuit design that fail to meet the criteria. As shown in FIG. 9, the partition module 912 partitions the design into a partition for block $D_1$ and a partition for block $D_2$ based on the evaluation.

The exploration module 914 evaluates the blocks $D_1$ and $D_2$ and selects synthesis engine configurations for the blocks that are configured to address the criteria. In the example illustrated in FIG. 9, the exploration module 914 selects synthesis engine configurations $E_2$, $E_3$, and $E_5$ for block $D_1$ and synthesis engine configurations $E_3$, $E_4$, and $E_5$ for block $D_2$.

The synthesis module 916 prepares the blocks $D_1$ and $D_2$ for synthesis using the selected synthesis engine configurations and dispatches the synthesis runs. In addition, backdrop synthesis 930 is performed. In particular, a suitable HDL wrapper for both blocks $D_1$ and $D_2$ is generated and used to modify or supplement the original design description D. A backdrop synthesis run using synthesis engine configuration $E_0$ is performed and the backdrop netlist generated (shown in FIG. 9 as "D−($D_1$+$D_2$)"). For the synthesis engine configurations $E_2$ and $E_3$ selected for block $D_1$, the synthesis module 916 generates a suitable HDL wrapper for $D_1$ in the original design description and dispatches separate synthesis runs, which are evaluated by the evaluation module 918. For the synthesis engine configurations $E_3$ and $E_4$ selected for block $D_2$, the synthesis module 916 generates a suitable HDL wrapper for $D_2$ in the original design description and dispatches separate synthesis runs, which are also evaluated by the evaluation module 918. (It should be noted that, in this example, separate synthesis runs are performed using synthesis engine configuration $E_3$, even though the configuration was selected for both of the blocks $D_1$ and $D_2$.) The evaluation module 918 selects one of the netlists generated by the synthesis runs for each of the blocks $D_1$ and $D_2$. The selected $D_1$ netlist and the selected $D_2$ netlist are then assembled with the backdrop netlist ("D–($D_1$+$D_2$)") into a full netlist ("full netlist$_1$") at 920.

For synthesis engine configuration $E_5$, assembly-free synthesis is performed at 932. It may be desirable to perform assembly-free synthesis for the configuration $E_5$ because the synthesis tool implementing the configuration $E_5$ may not allow access to netlists that it produces, thereby preventing the manipulations necessary to assemble the resulting netlist with other netlists. As shown in FIG. 9, the backdrop netlist ("D–($D_1$+$D_2$)") is used to represent the rest of the circuit design in the circuit description that is input into the synthesis tool. The synthesis run using synthesis engine configuration $E_5$ produces a full netlist ("full netlist$_2$").

The netlist evaluation module 922 can evaluate the two full netlists and select one final netlist based on one or more criteria (e.g., the criteria initially used by the partition module 912 or new criteria input by the user). The criteria can include, for example, one or more of timing behavior, area, power consumption, or other such design or performance criteria.

K. Target Architecture Exploration

Embodiments of the disclosed technology can also be used or modified to allow a user to explore different possible target architectures and to select from among them. Such embodiments can be particularly useful when performing FPGA synthesis because there exist a variety of different FPGA architectures, each having different hardware resources and performance characteristics.

In one exemplary embodiment, one or more types of architectures (e.g., the vendor and model of FPGA) are selected by the exploration module 1014 as part of the synthesis engine configurations selected. For example, the exploration module 1014 can select different sets of synthesis engine configurations for the synthesis runs, each targeting a different target architecture. For instance, a first set of synthesis engine configurations can be selected for the partitioned blocks and for the backdrop run, all targeting a single target architecture, and a second set of synthesis engine configurations can be selected for the partitioned blocks and for the backdrop run, all targeting a different target architecture. The synthesis runs can then be performed using the different synthesis engine configurations. For each candidate target architecture, full netlists can be assembled, each representing the optimized netlist for that architecture and including netlist portions that were optimized using the partitioning and selection procedures described above. The target architectures to be explored can be selected by the user (e.g., using a suitable graphical user interface) or selected using data in the engine characteristic database. For instance, the data stored in the engine configuration database can include information identifying a particular target architecture, information indicating the resources available in the target architecture, and/or information indicating the cost of the target architecture.

Figure 10:
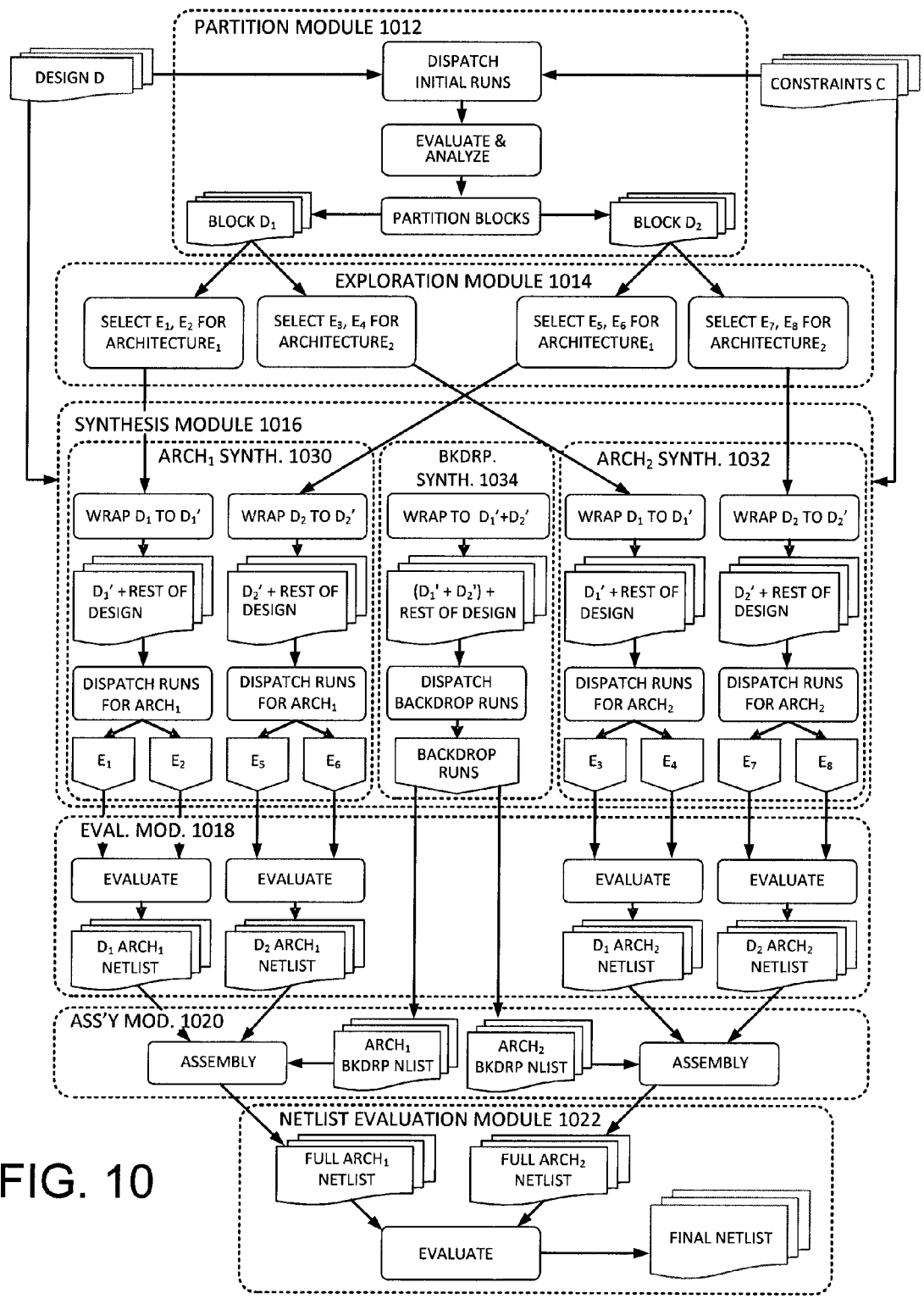
FIG. 10 is a block diagram illustrating an exemplary synthesis flow in which different target architectures are explored according to embodiments of the disclosed technology.

FIG. 10 illustrates one exemplary embodiment of a synthesis tool 1000 configured to perform target architecture exploration. Furthermore, FIG. 10 illustrates how the synthesis tool 1000 might synthesize a particular design D into a final netlist. Unless otherwise stated, the particular modules shown in FIG. 10 can operate in accordance with any of the methods and features described in the previous sections.

As shown, the partition module 1012 performs one or more initial synthesis runs (not specifically shown) using one or more synthesis engine configurations. The partition module 1012 also evaluates the results of the synthesis run according to one or more criteria and identifies sections of the circuit design that fail to meet the criteria. As shown in FIG. 10, the partition module 1012 partitions the design into a partition for block $D_1$ and a partition for block $D_2$ based on the evaluation.

The exploration module 1014 evaluates the blocks $D_1$ and $D_2$ and selects synthesis engine configurations for the blocks that are configured to address the criteria. In the illustrated embodiment, the exploration module 1014 also selects candidate synthesis engine configurations for two or more target architectures (designated as "architecture$_1$" and "architecture$_2$"). In particular, the exploration module 1014 selects synthesis engine configurations $E_1$ and $E_2$ (both of which use architecture$_1$) for the block $D_1$ and configurations $E_5$ and $E_6$ (both of which use architecture$_1$) for the block $D_2$. Additionally, the exploration module 1014 selects synthesis engine configurations $E_3$ and $E_4$ (both of which use architecture$_2$) for the block $D_1$ and configurations $E_7$ and $E_8$ (both of which use architecture$_2$) for the block $D_2$.

In some cases, a target architecture may not have the requisite number or type of hardware resources for implementing a design. The exploration module 1014 can also be used to identify target architectures that cannot support the design. For instance, the exploration module 1014 can perform an initial evaluation of the design to determine the minimum number of I/Os and/or the minimum number of hardware resources (such as DSPs or block RAMs) for implementing a design. Based on this evaluation, certain target architectures can be removed from consideration or identified as being insufficient to implement the design alone (in which case, multiple target architectures may be used to implement the design and the synthesis runs will have to be run accordingly).

The synthesis module 1016 prepares the blocks $D_1$ and $D_2$ for synthesis using the selected synthesis engine configurations and dispatches the synthesis runs. In this embodiment, full netlists will be generated for each candidate target architecture. Accordingly, backdrop synthesis runs are performed at 1034 to generate multiple backdrop netlists. For example, in the illustrated embodiment, backdrop netlists are created for each of the target architectures (shown as "arch$_1$ bkdrp nlist" and "arch$_2$ bkdrp nlist"). Synthesis runs are also dispatched for each target architecture according to the selected synthesis engine configurations. These architecture-specific synthesis runs are shown in FIG. 10 as arch$_1$ synthesis 1030 and arch$_2$ synthesis 1032.

The evaluation module 1018 also evaluates and selects netlists for each target architecture. In other words, the evaluation module 1018 treats the netlists for each target architecture separately. For example, the evaluation module 1018 selects one of the netlists generated by the synthesis runs for each of the blocks $D_1$ and $D_2$ for architecture$_1$ and selects one of the netlists generated by the synthesis runs for each of the blocks $D_1$ and $D_2$ for architectures. The selected $D_1$ and $D_2$ netlists for architecture$_1$ are then assembled with the architecture$_1$ backdrop netlist into a full architecture$_1$ netlist ("full arch$_1$ netlist"). The selected $D_1$ and $D_2$ netlists for architectures are also assembled with the archictecture$_2$ backdrop netlist into a full architectures netlist ("full arch$_2$ netlist").

Netlist evaluation module 1022 evaluates the full netlists generated for each target architecture and selects one as the final netlist. In FIG. 10, for example, the netlist evaluation module 1022 evaluates full $arch_1$ netlist and full $arch_2$ netlist and selects one based on one or more criteria. For example, the final netlist can be evaluated on the criteria initially used by the partition module 1012 or new criteria input by the user. The criteria can include, for example, one or more of timing behavior, area, power consumption, or other such design or performance criteria. Furthermore, in this embodiment, the criteria can include the cost of the target architecture. These criteria can be considered alone or as a combination of one another (e.g., as a weighted factor).

In the embodiment shown in FIG. 10, the original design description D is partitioned into one or more circuit sections. In other embodiments, however, various synthesis engine configurations are considered for the design in its entirety. For example, the exploration module can select one or more synthesis engine configurations targeting one or more target architectures without partitioning the design. An example of one such embodiment is shown in FIG. 11.

Figure 11:
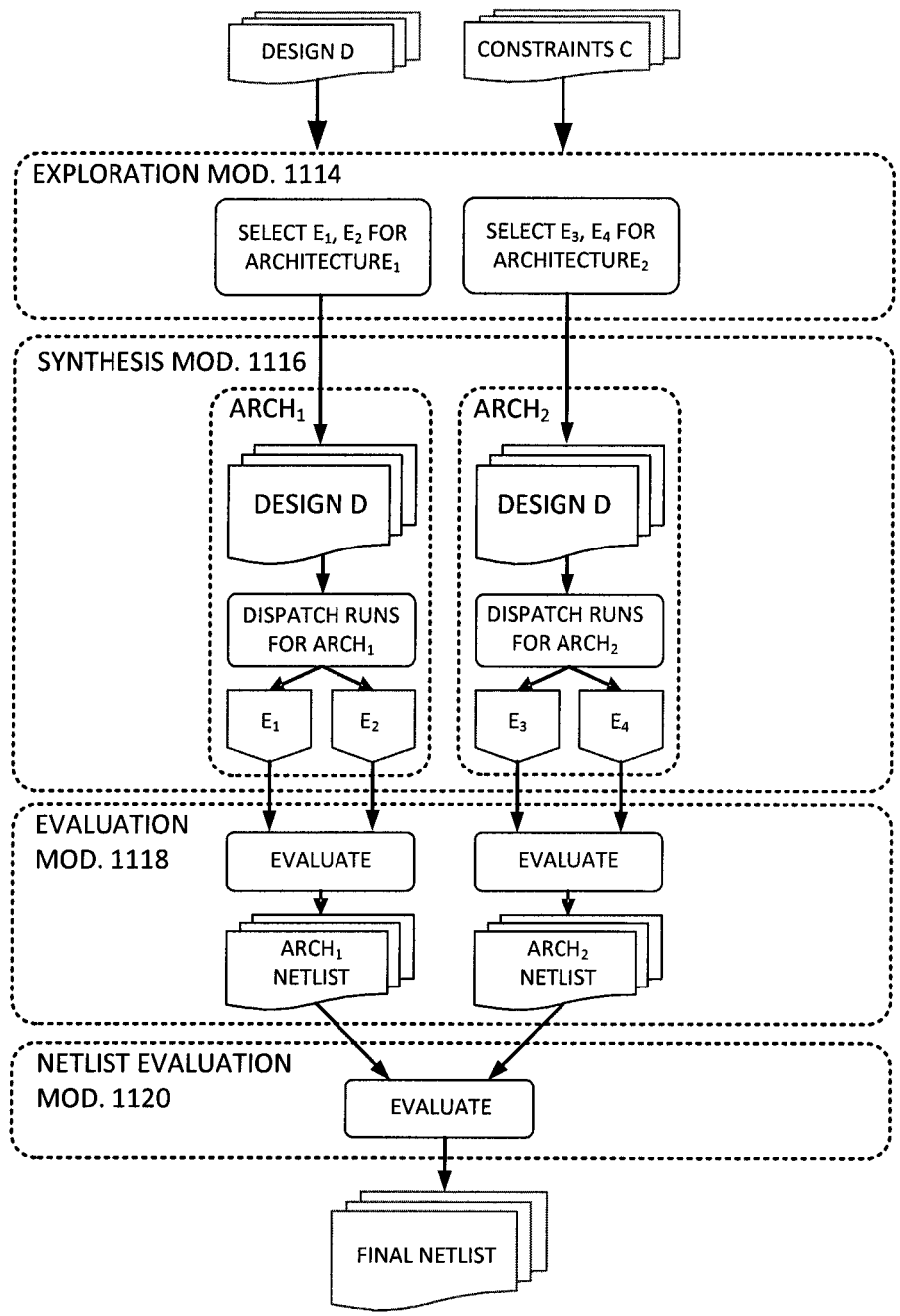
FIG. 11 is a block diagram illustrating another exemplary synthesis flow in which different target architectures are explored according to embodiments of the disclosed technology.

FIG. 11 illustrates an exemplary embodiment of a synthesis tool 1100 configured to perform target architecture exploration for a high-level description of an entire circuit design. In FIG. 11, exploration module 1114 can select two or more synthesis engine configurations for the high-level description of the entire design (shown in FIG. 11 as "design D"). For example, synthesis engine configurations targeting different target architectures can be selected. Furthermore, multiple synthesis engine configurations for each candidate target architecture can be selected. The synthesis engine configurations can be selected based on a variety of criteria. The criteria can include, for example, one or more of timing behavior, area, power consumption, or other such design or performance criteria. Furthermore, in this embodiment, the criteria can include the cost of the target architecture. These criteria can be considered alone or as a combination of one another (e.g., as a weighted factor). In the example shown in FIG. 11, synthesis engine configurations $E_1$ and $E_2$ (targeting $architecture_1$) and $E_3$ and $E_4$ (targeting $architecture_2$) are selected.

In some cases, a target architecture may not have the requisite number or type of hardware resources for implementing a design. The exploration module 1114 can also be used to identify target architectures that cannot support the design. For instance, the exploration module 1114 can perform an initial evaluation of the design to determine the minimum number of I/Os and/or the minimum number of hardware resources (such as DSPs or block RAMs) for implementing a design. Based on this evaluation, certain target architectures can be removed from consideration or identified as being insufficient to implement the design alone (in which case, multiple target architectures may be used to implement the design and the synthesis runs will have to be run accordingly).

The synthesis module 1116 prepares synthesis runs for the selected synthesis engine configurations and dispatches the synthesis runs. In this embodiment, full netlists will be generated for each target architecture under consideration. Accordingly, synthesis runs are dispatched for each target architecture using the selected synthesis engine configurations. These architecture-specific synthesis runs are shown in FIG. 11 as $arch_1$ and $arch_2$ synthesis. Because the synthesis runs are intended to be for the entire design, no assembly of a final netlist from candidate netlist portions is necessary.

The evaluation module 1118 evaluates and selects the final netlist for each target architecture. In other words, the evaluation module 1118 treats the netlists for each target architecture separately. Thus, in FIG. 11, two netlists are selected, one for $architecture_1$ and one for $architectures_2$ (shown in FIG. 11 as "$arch_1$ netlist" and "$arch_2$ netlist"). The criteria used to select the netlists can be the same as the criteria used by the exploration module or new criteria selected by the user.

The netlist evaluation module 1122 evaluates the full netlists generated for each target architecture and selects one as the final netlist. In FIG. 11, for example, the netlist evaluation module 1122 evaluates $arch_1$ netlist and $arch_2$ netlist and selects one of them based one or more criteria. The final netlist can be evaluated on the criteria initially used by the exploration module 1114 or new criteria input by the user. The criteria can include, for example, one or more of timing behavior, area, power consumption, or other such design or performance criteria. Furthermore, in this embodiment, the criteria can include the cost of the target architecture. These criteria can be considered alone or as a combination of one another (e.g., as a weighted factor).

IV. Exemplary Network Environments for Applying the Disclosed Techniques

Figure 12:
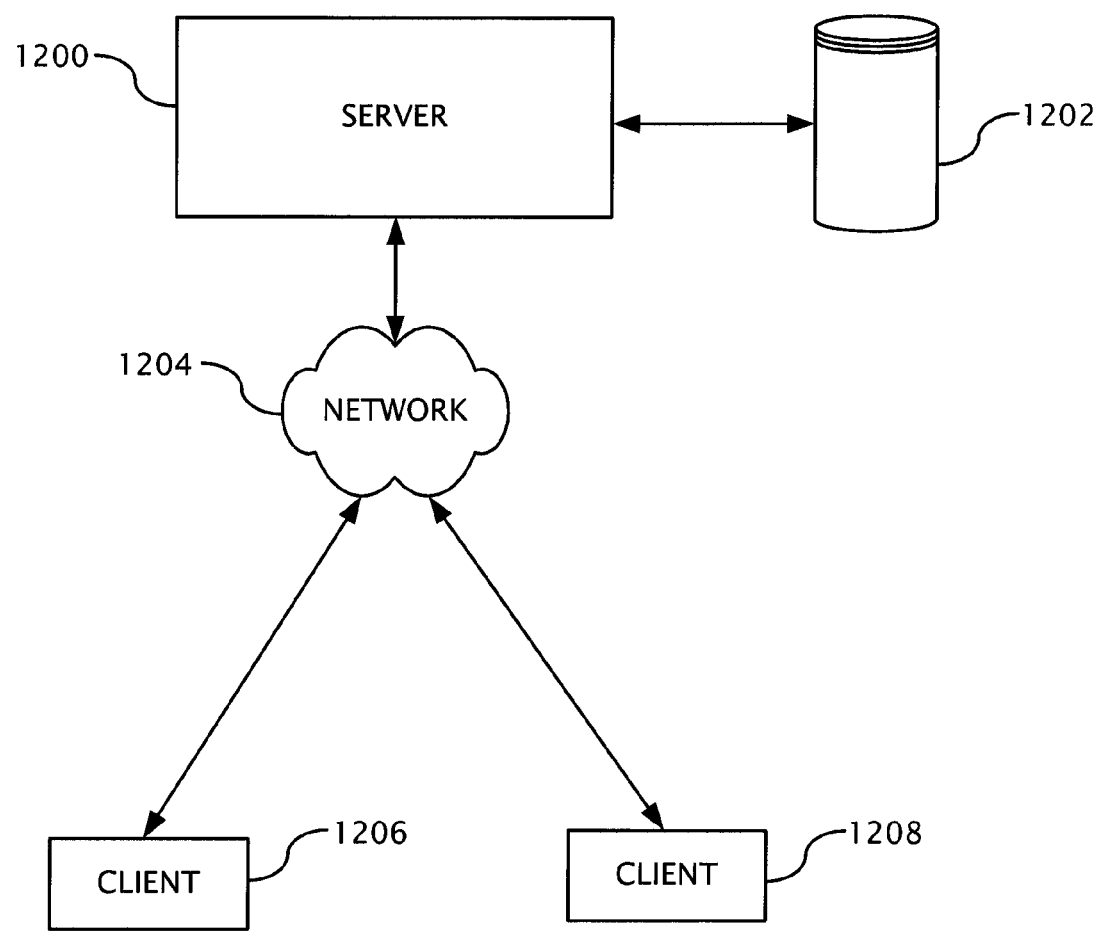
FIG. 12 is a block diagram illustrating a computer network that can be used to perform any of the embodiments of the disclosed technology.

Any of the aspects of the technology described above may be performed using a distributed computer network, such as the computing environment described above with respect to FIG. 1. FIG. 12 shows a simplified embodiment of one such exemplary network. A server computer 1200 can have an associated storage device 1202 (internal or external to the server computer). For example, the server computer 1200 can be configured to perform synthesis according to any of the disclosed embodiments (e.g., as part of an EDA software tool). The server computer 1200 can be coupled to a network, shown generally at 1204, which can comprise, for example, a wide-area network, a local-area network, a client-server network, the Internet, or other such network. One or more client computers, such as those shown at 1206, 1208, may be coupled to the network 1204 using a network protocol. The work may also be performed on a single, dedicated workstation, which has its own memory and one or more CPUs.

Figure 13:
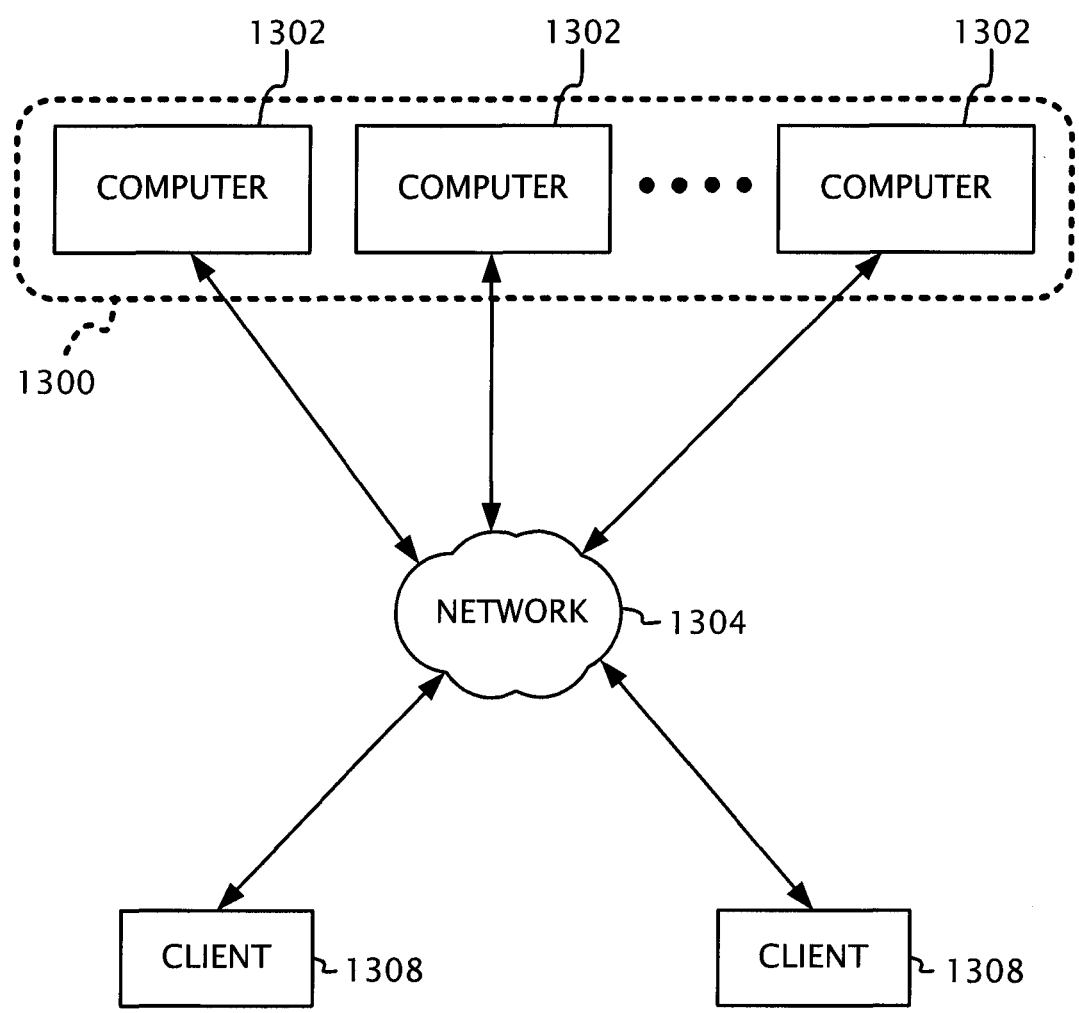
FIG. 13 is a block diagram illustrating another computer network that can be used to perform any of the embodiments of the disclosed technology.

FIG. 13 shows another exemplary network. One or more computers 1302 communicate via a network 1304 and form a computing environment 1300 (e.g., a distributed computing environment). Each of the computers 1302 in the computing environment 1300 can be used to perform at least a portion of the synthesis technique according to any of the disclosed embodiments (e.g., as part of an EDA software tool). The network 1304 in the illustrated embodiment is also coupled to one or more client computers 1308.

Figure 14:
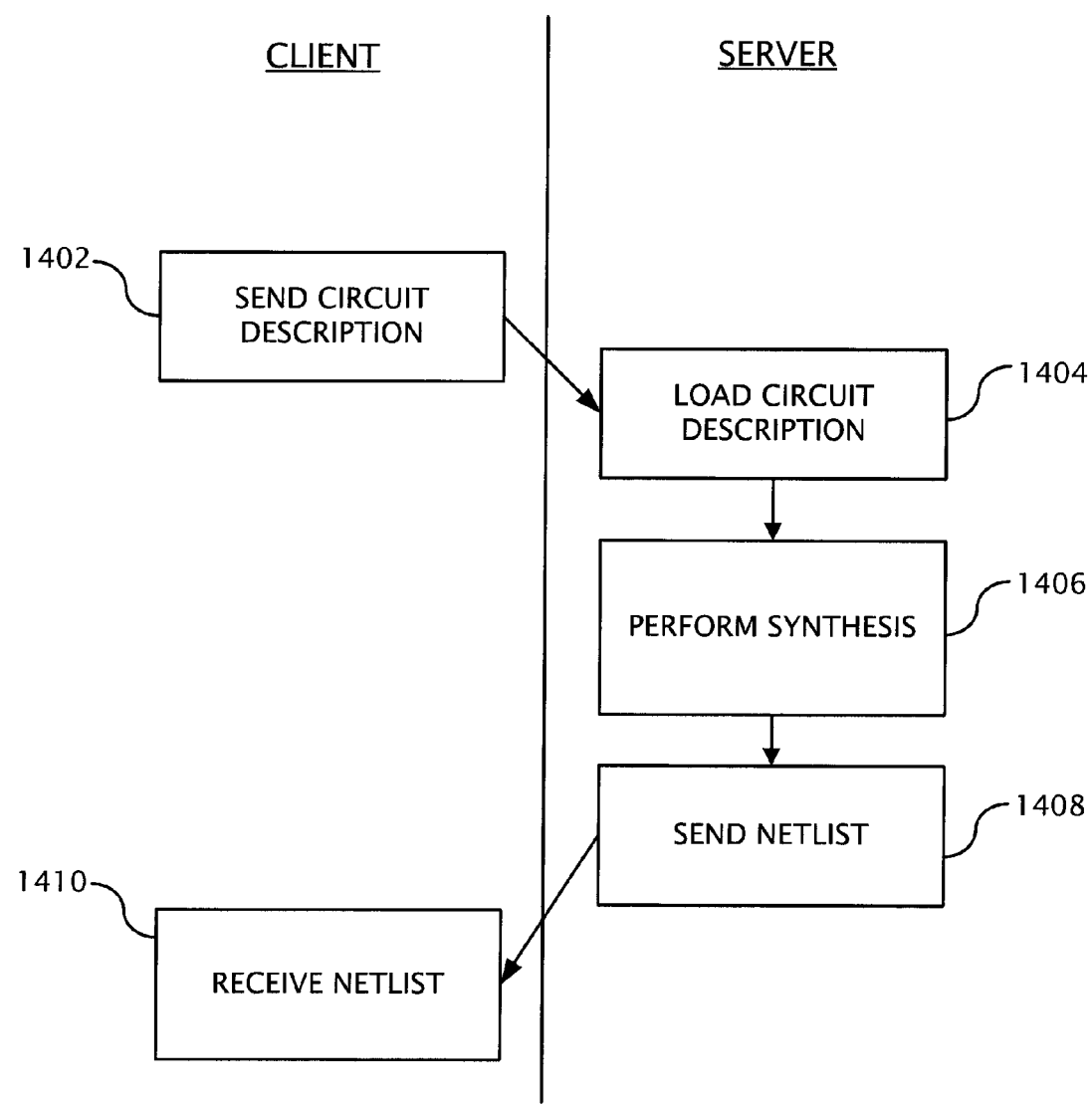
FIG. 14 is a block diagram illustrating how the computer networks of FIG. 1, 12, or 13 can be used to perform aspects of the disclosed technology.

FIG. 14 shows one exemplary manner in which a circuit description (e.g., an HDL description, such as a VHDL, SystemVerilog, Verilog, or other such high-level description indicative of a circuit design) can be synthesized using a remote server computer (such as the server computer 1200 shown in FIG. 12 or the master computer 103 of FIG. 1) or a remote computing environment (such as the computing environment 1300 shown in FIG. 13) using any of the embodiments disclosed herein. At process block 1402, for example, the client computer sends or transmits the high-level description to the remote server or computing environment. In process block 1404, the description is received and loaded by the remote server or by respective components of the remote computing environment. In process block 1406, synthesis is performed using any of the disclosed embodiments. At process block 1408, the remote server or computing environment sends the resulting gate-level netlist or netlist portions to the client computer, which receives the data at process block 1410. It should be apparent to those skilled in the art that the example shown in FIG. 14 is not the only way to perform synthesis using multiple computers. For instance, the circuit description may be stored on a computer-readable medium that is not on a network and that is sent separately to the server or computing environment (e.g., a CD-ROM, DVD, or portable hard drive). Or, the server computer or remote computing environment may perform only a portion of the synthesis procedures.

Figure 15:
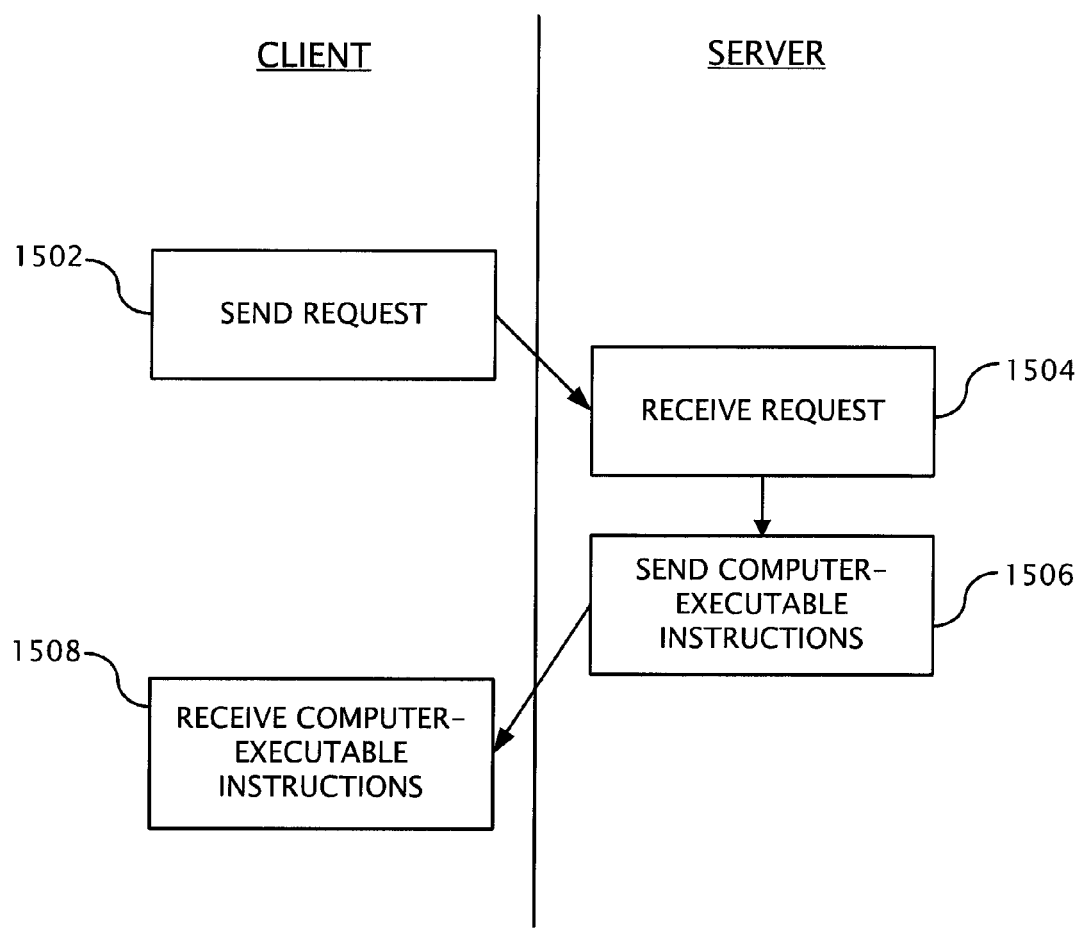
FIG. 15 is a block diagram illustrating how the computer networks of FIG. 1, 12, or 13 can be used to transmit computer-executable instructions for performing any of the disclosed methods.

FIG. 15 shows one exemplary manner in which computer-executable instructions for performing any of the disclosed embodiments can be transmitted, accessed, or received using a remote server computer (such as the server computer 1200 shown in FIG. 12 or the master computer 103 of FIG. 1) or a remote computing environment (such as the computing environment 1300 shown in FIG. 13) At process block 1502, for example, the client computer sends a request to download computer-executable instructions for performing any of the disclosed methods or techniques (e.g., after purchasing a license to a synthesis tool, such as any of the embodiments of the synthesis tool 300). In process block 1404, the request is received by the remote server or by respective components of the remote computing environment. In process block 1406, the remote server or computing environment transmits computer-executable instructions for performing any of the disclosed methods or techniques (e.g., computer-executable instructions for implementing any of the embodiments of synthesis tool 300 on a computer). At 1408, the computer-executable instructions are received (e.g., stored, buffered, and/or executed) by the client computer.

Having illustrated and described the principles of the illustrated embodiments, it will be apparent to those skilled in the art that the embodiments can be modified in arrangement and detail without departing from such principles. For example, although many of the embodiments described herein imply that only a single target architecture exists, any of the disclosed embodiments can also be used to perform synthesis for designs to be implemented on a plurality of target architectures (e.g., a plurality of FPGAs). Furthermore, although embodiments described herein are used to generate a desired netlist, any of the embodiments disclosed herein can be used to generate a desirable constraints file for use during place and route as well.

In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. One or more tangible non-transitory computer-readable storage media storing computer-executable instructions, which when executed by a computer, cause the computer to perform a computer-implemented synthesis method comprising:

performing a first synthesis run on a high-level description of a circuit design by synthesizing the high-level description with a first synthesis engine configuration in order to generate a lower-level description and one or more performance reports; and subsequent to the first synthesis run:

a) identifying one or more sections of the high-level description to be synthesized in a second synthesis run with a second synthesis engine configuration that is different than the first synthesis engine configuration in order to generate a second lower-level description, wherein said identifying comprises evaluating at least one of the high-level description or the one or more performance reports according to one or more criteria, and generating indications of the identified one or more sections, wherein the one or more criteria comprise at least one of estimated timing behavior, area, or power consumption of the at least two lower-level descriptions; and b) performing the second synthesis run on the identified one or more sections of the high-level description with the second synthesis engine configuration, wherein at least one of the first synthesis run or the second synthesis run is performed by a remote computing resource.

2. One or more tangible non-transitory computer-readable storage media storing computer-executable instructions, which when executed by a computer, cause the computer to perform a computer-implemented synthesis method comprising:

performing a first synthesis run on a high-level description of a circuit design by synthesizing the high-level description with a first synthesis engine configuration that targets a first type of field programmable gate array in order to generate a lower-level description and one or more performance reports; and subsequent to the first synthesis run:

a) identifying one or more sections of the high-level description to be synthesized in a second synthesis run with a second synthesis engine configuration that is different than the first synthesis engine configuration and that targets a second type of field programmable gate array, wherein said identifying comprises evaluating at least one of the high-level description or the one or more performance reports according to one or more criteria, and generating indications of the identified one or more sections; and b) performing the second synthesis run on the identified one or more sections of the high-level description with the second synthesis engine configuration.

3. The one or more tangible non-transitory computer-readable storage media of claim 2, wherein the one or more criteria comprise an estimated cost of the first field programmable gate array and the second field programmable gate array.

4. One or more tangible non-transitory computer-readable storage media storing computer-executable instructions, which when executed by a computer, cause the computer to perform a computer-implemented synthesis method comprising:

performing a first synthesis run on a high-level description of a circuit design by synthesizing the high-level description with a first synthesis engine configuration in order to generate a lower-level description and one or more performance reports; and subsequent to the first synthesis run:

a) identifying one or more sections of the high-level description to be synthesized in a second synthesis run with a second synthesis engine configuration that is different than the first synthesis engine configuration, wherein said identifying comprises evaluating at least one of the high-level description or the one or more performance reports according to one or more criteria, and generating indications of the identified one or more sections;

b) performing the second synthesis run on the identified one or more sections of the high-level description with the second synthesis engine configuration in order to generate a second lower-level description;

c) selecting a preferred one of the lower-level descriptions; and d) replacing a corresponding portion of a lower-level description of the circuit with the preferred one of the lower level descriptions, thereby creating a modified lower-level description of the circuit.

5. One or more tangible non-transitory computer-readable storage media storing computer-executable instructions which when executed by a computer, cause the computer to perform a computer-implemented synthesis method comprising:

instructing a first computing resource to perform synthesis of the high-level description with a first synthesis tool from a first vendor to generate a first netlist portion for a first portion of a circuit design;

instructing a second computing resource to simultaneously perform synthesis of the high-level description with a second synthesis tool from a second vendor different than the first vendor to generate a second netlist portion for a second portion of the circuit design, wherein the first computing resource and the second computing resource are remote computing resources; and generating a full netlist for the circuit design, the full netlist comprising the first netlist portion and the second netlist portion.

6. The one or more tangible non-transitory computer-readable storage media of claim 5, wherein the first netlist portion is part of a full netlist generated by the first synthesis run.

7. The one or more tangible non-transitory computer-readable storage media of claim 5, wherein the computer-implemented synthesis method further comprises:

performing a preliminary synthesis run for a high-level description of the circuit design; and identifying the first portion of the circuit design and the second portion of the circuit design with results of the preliminary synthesis run.

8. One or more tangible non-transitory computer-readable storage media storing computer-executable instructions, which when executed by a computer, cause the computer to perform a computer-implemented synthesis method comprising:

performing a first synthesis run on a high-level description of a circuit design by synthesizing the high-level description with a first synthesis engine configuration in order to generate a lower-level description and one or more performance reports; and subsequent to the first synthesis run:

a) identifying one or more sections of the high-level description to be synthesized in a second synthesis run with a second synthesis engine configuration that is different than the first synthesis engine configuration in order to generate a second lower-level description, wherein said identifying comprises evaluating at least one of the high-level description or the one or more performance reports according to one or more criteria, wherein the one or more criteria include timing behavior, and wherein the evaluating comprises:

identifying one or more paths in the circuit design that fail a timing constraint;

identifying one or more portions of the circuit design that are traversed by the one or more paths; and including at least one of the portions of the circuit design traversed by the one or more paths as at least one of the sections identified, and generating indications of the identified one or more sections; and b) performing the second synthesis run on the identified one or more sections of the high-level description with the second synthesis engine configuration.

9. The one or more tangible non-transitory computer-readable storage media of claim 8, wherein at least one of the first synthesis run or the second synthesis run is performed by a remote computing resource.

10. One or more tangible non-transitory computer-readable storage media storing computer-executable instructions, which when executed by a computer, cause the computer to perform a computer-implemented synthesis method comprising:

performing a first synthesis run on a high-level description of a circuit design by synthesizing the high-level description with a first synthesis engine configuration in order to generate a lower-level description and one or more performance reports; and subsequent to the first synthesis run:

a) identifying one or more sections of the high-level description to be synthesized in a second synthesis run with a second synthesis engine configuration that is different than the first synthesis engine configuration in order to generate a second lower-level description, wherein said identifying comprises evaluating at least one of the high-level description or the one or more performance reports according to one or more criteria, wherein the one or more criteria include whether proprietary IP is present, and wherein the evaluating comprises:

identifying a section of the high-level description as being proprietary IP; and including the section as at least one of the sections identified, and generating indications of the identified one or more sections; and b) performing the second synthesis run on the identified one or more sections of the high-level description with the second synthesis engine configuration.

11. The one or more tangible non-transitory computer-readable storage media of claim 10, wherein at least one of the first synthesis run or the second synthesis run is performed by a remote computing resource.

12. One or more tangible non-transitory computer-readable storage media storing computer-executable instructions, which when executed by a computer, cause the computer to perform a computer-implemented synthesis method comprising:

performing a first synthesis run on a high-level description of a circuit design by synthesizing the high-level description with a first synthesis engine configuration in order to generate a lower-level description and one or more performance reports; and subsequent to the first synthesis run:

a) identifying one or more sections of the high-level description to be synthesized in a second synthesis run with a second synthesis engine configuration that is different than the first synthesis engine configuration in order to generate a second lower-level description, wherein said identifying comprises evaluating at least one of the high-level description or the one or more performance reports according to one or more criteria, and generating indications of the identified one or more sections, wherein the generating the indications of the identified one or more sections comprises generating one or more HDL wrappers corresponding to the identified one or more sections; and b) performing the second synthesis run on the identified one or more sections of the high-level description with the second synthesis engine configuration.

13. The one or more tangible non-transitory computer-readable storage media of claim 12, wherein at least one of the first synthesis run or the second synthesis run is performed by a remote computing resource.

14. One or more tangible non-transitory computer-readable storage media storing computer-executable instructions which when executed by a computer, cause the computer to perform a computer-implemented synthesis method comprising:

instructing a first computing resource to perform synthesis of the high-level description with a first synthesis tool from a first vendor to generate a first netlist portion for a first portion of a circuit design;

instructing a second computing resource to simultaneously perform synthesis of the high-level description with a second synthesis tool from a second vendor different than the first vendor to generate a second netlist portion for a second portion of the circuit design;

generating a full netlist for the circuit design, the full netlist comprising the first netlist portion and the second netlist portion;

performing a preliminary synthesis run for a high-level description of the circuit design; and identifying the first portion of the circuit design and the second portion of the circuit design with results of the preliminary synthesis run; and identifying a first synthesis engine configuration for the first synthesis run and a second synthesis engine configuration for the second synthesis run with the results of the preliminary synthesis run.

15. The one or more tangible non-transitory computer-readable storage media of claim 14, wherein the method further comprises identifying a first synthesis engine configuration for the first synthesis run and a second synthesis engine configuration for the second synthesis run with the results of the preliminary synthesis run.

\* \* \* \* \*